(12) United States Patent  (10) Patent No.: US 12,010,872 B2
Kim  (45) Date of Patent: Jun. 11, 2024

(54) DISPLAY DEVICE

(71) Applicant: Samsung Display Co., Ltd., Yongin-Si (KR)

(72) Inventor: Keunwoo Kim, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 151 days.

(21) Appl. No.: 17/526,343

(22) Filed: Nov. 15, 2021

(65) Prior Publication Data
US 2022/0262881 A1 Aug. 18, 2022

(30) Foreign Application Priority Data

Feb. 17, 2021 (KR) .................. 10-2021-0021443

(51) Int. Cl.
*H01L 27/14* (2006.01)
*H10K 59/121* (2023.01)
(Continued)

(52) U.S. Cl.
CPC ......... *H10K 59/1213* (2023.02); *H10K 71/00* (2023.02); *H01L 27/1222* (2013.01);
(Continued)

(58) Field of Classification Search
CPC ............... H10K 59/1213; H10K 71/00; H10K 59/1201; H10K 59/131; H01L 27/1222;
(Continued)

(56) References Cited

U.S. PATENT DOCUMENTS 5,446,304 A  8/1995 Sameshima et al.
8,698,971 B2 * 4/2014 Oh .................... H01L 29/78696
349/47
(Continued)

FOREIGN PATENT DOCUMENTS

CN  111834416 A  10/2020
JP  2003017502 A  1/2003
(Continued)

OTHER PUBLICATIONS

Extended European Search Report for Application No. 22157104.5-1020 dated Jun. 29, 2022.

*Primary Examiner* — Tan N Tran
(74) *Attorney, Agent, or Firm* — CANTOR COLBURN LLP

(57) ABSTRACT

A display device may include a substrate, a first active layer disposed on the substrate and including a first source region, a first drain region, and a first channel region disposed between the first source region and the first drain region, a first gate insulating layer covering the first active layer on the substrate, first gate electrodes disposed in opposite sides of the first channel region on the first gate insulating layer, a second gate insulating layer covering the first gate electrodes on the first gate insulating layer, a second gate electrode disposed in a central portion of the first channel region on the second gate insulating layer, and a first connection electrode disposed on the second gate electrode and connected to the first and second gate electrodes.

20 Claims, 15 Drawing Sheets

(51) Int. Cl.
*H10K 71/00* (2023.01)
*H01L 27/12* (2006.01)
*H01L 29/49* (2006.01)
*H01L 29/786* (2006.01)
*H10K 59/12* (2023.01)

(52) U.S. Cl.
CPC .... *H01L 29/4908* (2013.01); *H01L 29/78645* (2013.01); *H01L 29/78675* (2013.01); *H10K 59/1201* (2023.02)

(58) Field of Classification Search
CPC ........... H01L 29/4908; H01L 29/78645; H01L 29/78675; H01L 27/1237; H01L 27/124; H01L 29/42384; H01L 27/1248; H01L 27/1251; H01L 27/156; H01L 27/3276; H01L 51/56; H01L 227/323; G09G 3/3225; G09G 3/3266; G09G 3/3275
USPC ...................................................... 257/59, 72
See application file for complete search history.

(56) References Cited

U.S. PATENT DOCUMENTS

| | | | |
|---|---|---|---|
| 9,722,094 B2* | 8/2017 | Zhao | ................. H01L 29/78675 |
| 10,615,229 B2* | 4/2020 | Lee | ...................... H10K 77/111 |
| 11,164,526 B2 | 11/2021 | Kim et al. | |
| 2002/0009833 A1 | 1/2002 | Lin et al. | |
| 2002/0054522 A1 | 5/2002 | Inoue et al. | |
| 2003/0194839 A1 | 10/2003 | Chung | |
| 2004/0075092 A1 | 4/2004 | Arao | |
| 2007/0051956 A1 | 3/2007 | Shih et al. | |
| 2014/0353605 A1 | 12/2014 | Kim et al. | |

FOREIGN PATENT DOCUMENTS

| | | |
|---|---|---|
| KR | 100237868 B1 | 1/2000 |
| KR | 1020050081227 A | 6/2006 |
| KR | 1020170045781 A | 4/2017 |
| KR | 1020190112229 A | 10/2019 |
| KR | 102173707 B1 | 11/2020 |
| KR | 1020200124365 A | 11/2020 |

* cited by examiner

DISPLAY DEVICE

This application claims priority to Korean Patent Application No. 10-2021-0021443, filed on Feb. 17, 2021, and all the benefits accruing therefrom under 35 U.S.C. § 119, the content of which in its entirety is herein incorporated by reference.

BACKGROUND

1. Field

Embodiments provide generally to display device. More particularly, embodiments relate to a display device that reduces a leakage current.

2. Description of the Related Art

With a development of information technology, an importance of a display device as a connection medium between a user and information is being highlighted. Accordingly, an use of display devices such as liquid crystal display device, an organic light emitting display device, and a plasma display device is increasing.

The display device may be driven according to various driving frequencies. When the display device is driven at a driving frequency of 60 hertz (Hz), for example, the display device may display 60 image frames per second. When the display device is driven at a driving frequency of 30 Hz, for example, the display device may display 30 image frames per second.

SUMMARY

When a display device is driven at a low frequency, each pixel needs to maintain information about each image frame for a long time. In this case, when a leakage current occurs in each of the pixels, as the information on the image frame is not maintained, image deterioration or flicker may occur. That is, in order to drive the display device at a low frequency, a leakage current needs to be reduced.

Embodiments provide a display device that reduces leakage current.

A display device in an embodiment includes a substrate, a first active layer, a first gate insulating layer, first gate electrodes, a second gate insulating layer, a second gate electrode, and a first connection electrode. The first active layer is disposed on the substrate and includes a first source region, a first drain region, and a first channel region disposed between the first source region and the first drain region. The first gate insulating layer covers the first active layer on the substrate. The first gate electrodes are respectively disposed on opposite sides of the first channel region on the first gate insulating layer. The second gate insulating layer covers the first gate electrodes on the first gate insulating layer. The second gate electrode is disposed in a central portion of the first channel region on the second gate insulating layer. The first connection electrode is disposed on the second gate electrode and connected to the first and second gate electrodes.

In an embodiment, the display device may further include a second active layer, a third gate electrode, a fourth gate electrode, and a second connection electrode. The second active layer may be disposed on the substrate and include a second source region, a second drain region, and a second channel region disposed between the second source region and the second drain region. The third gate electrode may be disposed on the first gate insulating layer on a first side of the second channel region. The fourth gate electrode may be disposed on the second gate insulating layer on a second side of the second channel region. The second connection electrode may be disposed on the fourth gate electrode and be connected to the third and fourth gate electrodes.

In an embodiment, the first active layer, the first and second gate electrodes, the first connection electrode may be defined as a first transistor. The second active layer, the third and fourth gate electrodes, and the second connection electrode may be defined as a second transistor.

In an embodiment, the first transistor may be a switching transistor. The second transistor may be a driving transistor.

In an embodiment, each of the first and second active layers may include a silicon semiconductor.

In an embodiment, each of the first and second source regions and the first and second drain regions may be doped with P-type or N-type impurity ions.

In an embodiment, a shortest distance between the first active layer and the first gate electrodes may be smaller than a shortest distance between the first active layer and the second gate electrode.

In an embodiment, the first gate insulating layer may include silicon oxide and the second gate insulating layer includes silicon nitride.

In an embodiment, a same signal may be applied to the first and second gate electrodes.

In an embodiment, the same signal may be a scan signal.

In an embodiment, the display device may further include a first electrode disposed on the connection electrode, an emission layer disposed on the first electrode, and a second electrode disposed on the emission layer.

A display device in an embodiment includes a substrate, a first active layer, a first gate insulating layer, first gate electrodes, a second gate insulating layer, second gate electrodes, and a first connection electrode. The first active layer is disposed on the substrate. The first active layer includes a first active region including a first source region, a first drain region, and a first channel region, and a second active region including a second source region, a second drain region, and a second channel region. The first gate insulating layer covers the first active layer on the substrate. The first gate electrodes respectively overlap the first and second channel regions on the first gate insulating layer. The second gate insulating layer covers the first gate electrodes on the first gate insulating layer. The second gate electrodes respectively overlap the first and second channel regions on the second gate insulating layer. The first connection electrode is disposed on the second gate electrodes and connected to the first and second gate electrodes.

In an embodiment, the display device may further include a second active layer, third gate electrodes, a fourth gate electrode, and a second connection electrode. The second active layer may be disposed on the substrate. The second active layer may include a third active region including a third source region, a third drain region, and a third channel region, and a fourth active region including a fourth source region, a fourth drain region, and a fourth channel region. The third gate electrodes may respectively overlap the third and fourth channel regions on the first gate insulating layer. The fourth gate electrode may overlap the fourth channel region on the second gate insulating layer. The second connection electrode may be disposed on the fourth gate electrode and be connected to the third and fourth gate electrodes.

In an embodiment, the first active layer, the first and second gate electrodes, and the first connection electrode may be defined as a first dual transistor in which first transistors are connected in series. The second active layer, the third and fourth gate electrodes, and the second connection electrode may be defined as a second dual transistor in which second transistors are connected in series.

In an embodiment, the first drain region of the first active region may be connected to the second source region of the second active region. The third drain region of the third active region may be connected to the fourth source region of the fourth active region.

In an embodiment, each of the first and second active layers may include a silicon semiconductor.

In an embodiment, each of the first to fourth source regions and the first to fourth drain regions may be doped with P-type or N-type impurity ions.

In an embodiment, the second gate electrodes may be disposed between the first gate electrodes. The fourth gate electrode may be disposed between the third gate electrodes.

In an embodiment, a shortest distance between the first active layer and the first gate electrodes may be smaller than a shortest distance between the first active layer and the second gate electrodes.

In an embodiment, a same signal may be applied to the first and second gate electrodes.

A display device in an embodiment of the invention may include a first active layer including a first channel region, first gate electrodes disposed in opposite sides of the first channel region on the first active layer, a second gate electrode disposed in a central portion of the first channel region on the first gate electrodes, and a first connection electrode disposed on the second gate electrode and connecting the first and second gate electrodes. Accordingly, an aging of a transistor may be strengthened and a leakage current flowing through the transistor may be reduced.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
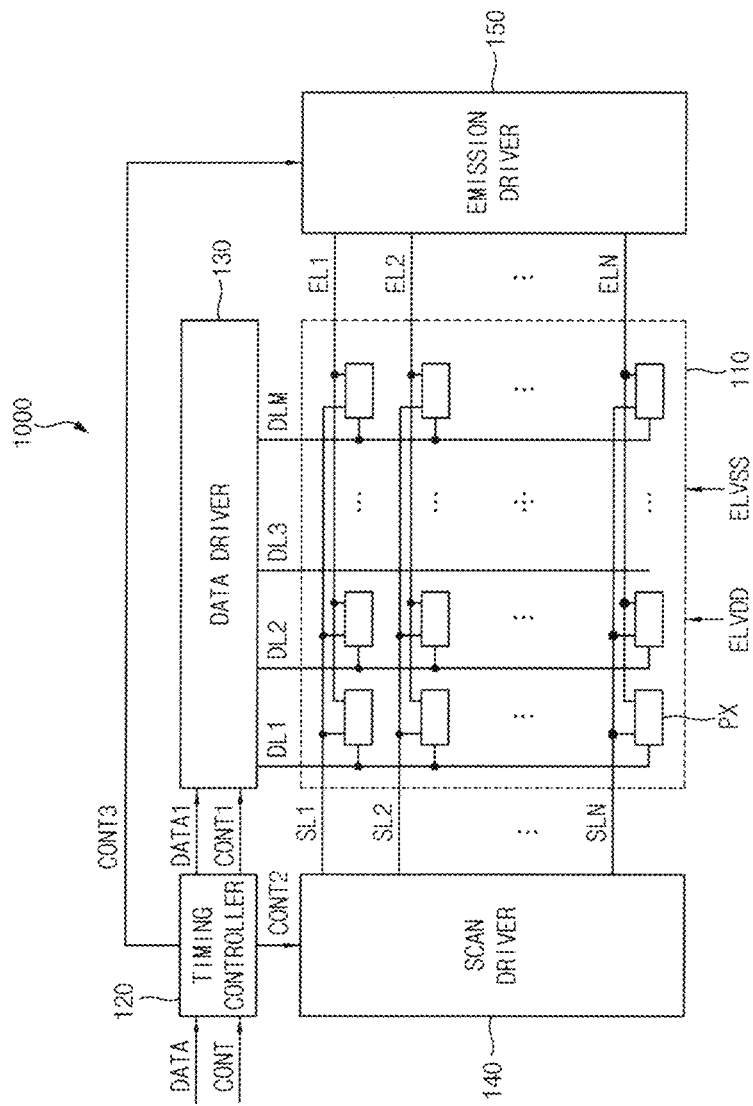
FIG. 1 is a block diagram illustrating an embodiment of a display device.

Hereinafter, embodiments of the invention will be explained in detail with reference to the accompanying drawings. The same reference numerals are used for the same components in the drawings, and redundant descriptions of the same components will be omitted.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

FIG. 1 is a block diagram illustrating an embodiment of a display device.

Referring to FIG. 1, the display device 1000 may include a display portion 110, a timing controller 120, a data driver 130, a scan driver 140, and an emission driver 150.

The display portion 110 may include a plurality of pixels PX. The plurality of pixels PX may include a plurality of scan lines SL1, SL2, . . . , SLN, a plurality of data lines DL1, DL2, . . . , DLM, and a plurality of emission control lines EL1, EL2, . . . , ELN (where N and M are natural numbers greater than 1).

The data lines DL1, DL2, . . . , DLM may be connected to the data driver 130 and transmit a data voltage to the pixels PX. The scan lines SL1, SL2, SLN may be connected to the scan driver 140 and transmit a scan signal to the pixels PX. The emission control lines EL1, EL2, . . . , ELN may be connected to the emission driver 150 and transmit an emission control signal to the pixels PX.

The pixels PX may receive a driving voltage ELVDD and a common voltage ELVSS. The pixels PX may receive the data voltage in response to the scan signal and may generate light of a gray level corresponding to the data voltage using the driving voltage ELVDD and the common voltage ELVSS.

The data driver 130 may convert a first data signal DATA1 into the data voltage in response to a first control signal CONT1 and output the data voltage to the data lines DL1, DL2, . . . , DLM.

The scan driver 140 may generate the scan signal in response to a second control signal CONT2.

The emission driver 150 may generate the emission control signal in response to a third control signal CONT3.

The timing controller 120 may receive a data signal DATA and a control signal CONT from an external device. In an embodiment, the data signal DATA may include red, green, and blue image data, for example. The control signal CONT may include a horizontal synchronization signal, a vertical synchronization, a main clock signal, or the like.

The timing controller 120 may generate a first control signal CONT1 for driving the data driver 130 based on the control signal CONT. In addition, the timing controller 120 may generate a second control signal CONT2 for driving the scan driver 140 and a third control signal CONT3 for driving the emission driver 150 based on the control signal CONT.

Figure 2:
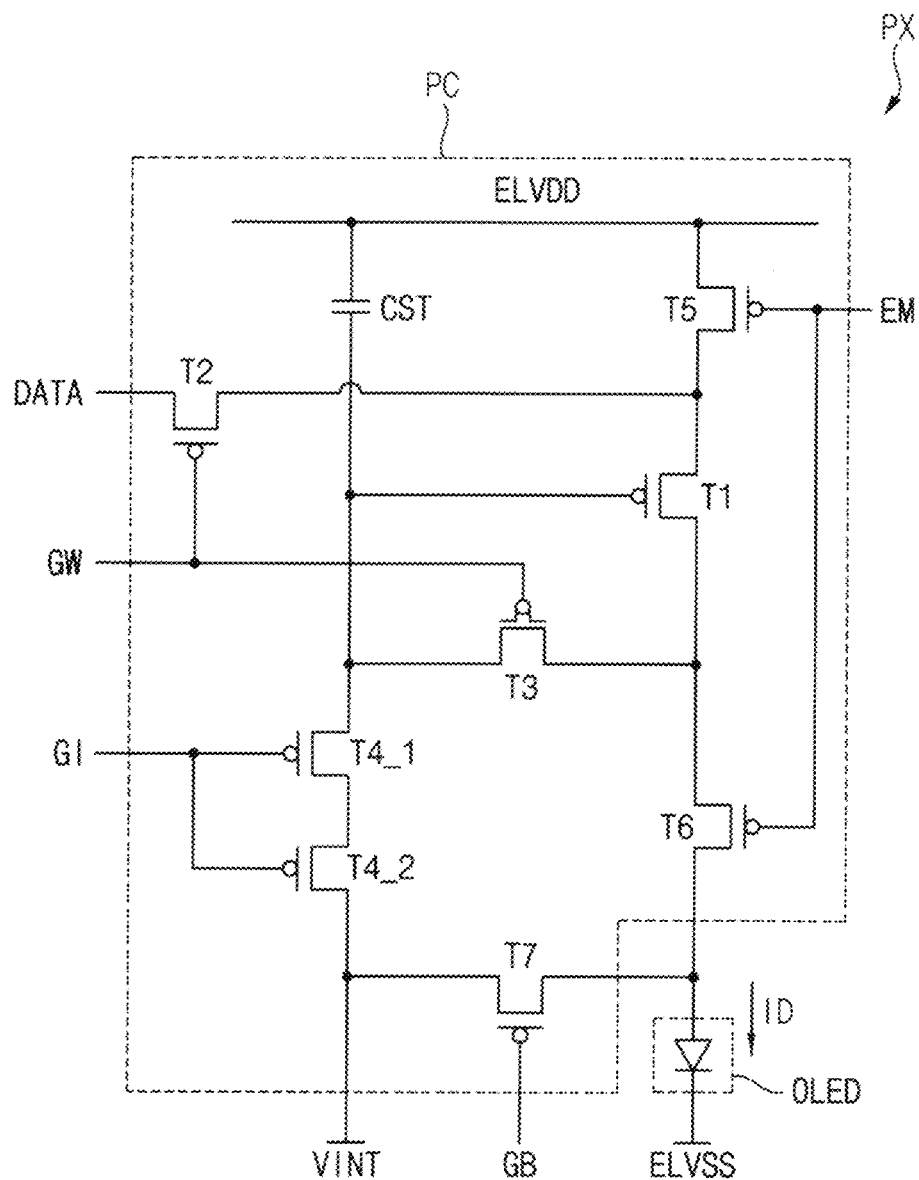
FIG. 2 is a circuit diagram illustrating a pixel disposed in a display portion of FIG. 1.

FIG. 2 is a circuit diagram illustrating a pixel disposed in a display portion of FIG. 1. In an embodiment, each of the pixels PX may include an emission element (e.g., an organic light emitting diode OLED) and a pixel circuit PC for driving the emission element, for example.

Referring to FIG. 2, the pixel circuit PC may include first to seventh transistors T1, T2, T3, T4_1, T4_2, T5, T6, and T7, a storage capacitor CST, a driving voltage line to which a driving voltage ELVDD is supplied, a common voltage line to which a common voltage ELVSS is supplied, an initialization voltage line to which an initialization voltage VINT is supplied, a data signal line to which a data signal DATA is supplied, a scan signal line to which a scan signal GW is supplied, a data initialization signal line to which a data initialization signal GI is supplied, a emission control signal line to which a emission control signal EM is supplied, a diode initialization signal line to which a diode initialization signal GB is supplied, or the like.

The organic light emitting diode OLED may output light based on a driving current. The organic light emitting diode OLED may include a first terminal and a second terminal. In an embodiment, the second terminal of the organic light emitting diode OLED may be supplied with the common voltage ELVSS. In an embodiment, the first terminal of the organic light emitting diode OLED may be an anode terminal and the second terminal of the organic light emitting diode OLED may be a cathode terminal, for example. In an alternative embodiment, the first terminal of the organic light emitting diode OLED may be a cathode terminal and the second terminal of the organic light emitting diode OLED may be an anode terminal.

The first transistor T1 may include a gate terminal, a first terminal, and a second terminal. In an embodiment, the first terminal of the first transistor T1 may be a source terminal and the second terminal of the first transistor T1 may be a drain terminal. In an alternative embodiment, the first terminal of the first transistor T1 may be a drain terminal and the second terminal of the first transistor T1 may be a source terminal.

The first transistor T1 may generate a driving current ID. In an embodiment, the first transistor T1 may operate in a saturation region. In this case, the first transistor T1 may generate the driving current ID based on a voltage difference between the gate terminal and the source terminal. In addition, a grayscale may be expressed based on a magnitude of the driving current ID supplied to the organic light emitting diode OLED, for example. In an alternative embodiment, the first transistor T1 may operate in a linear region. In this case, a grayscale may be expressed based on a sum of the times during which the driving current ID is supplied to the organic light emitting diode OLED within one frame.

The second transistor T2 may include a gate terminal, a first terminal, and a second terminal. The gate terminal of the second transistor T2 may receive the scan signal GW. The first terminal of the second transistor T2 may receive the data signal DATA. The second terminal of the second transistor T2 may be connected to the first terminal of the first transistor T1. In an embodiment, the first terminal of the second transistor T2 may be a source terminal and the second terminal of the second transistor T2 may be a drain terminal. In an alternative embodiment, the first terminal of the second transistor T2 may be a drain terminal and the second terminal of the second transistor T2 may be a source terminal.

The second transistor T2 may supply the data signal DATA to the first terminal of the first transistor T1 during an activation period of the scan signal GW. In this case, the second transistor T2 may operate in a linear region.

The third transistor T3 may include a gate terminal, a first terminal, and a second terminal. The gate terminal of the third transistor T3 may receive the scan signal GW. The first terminal of the third transistor T3 may be connected to the second terminal of the first transistor T1. The second terminal of the third transistor T3 may be connected to the gate terminal of the first transistor T1. In an embodiment, the first terminal of the third transistor T3 may be a source terminal and the second terminal of the third transistor T3 may be a drain terminal. In an alternative embodiment, the first terminal of the third transistor T3 may be a drain terminal and the second terminal of the third transistor T3 may be a source terminal.

The third transistor T3 may connect the gate terminal of the first transistor T1 and the first terminal of the first transistor T1 during an activation period of the scan signal GW. In this case, the third transistor T3 may diode-connect the first transistor T1 during an activation period of the scan signal GW. Since the first transistor T1 is diode-connected, a voltage difference equal to a threshold voltage of the first transistor T1 may occur between the first terminal of the first transistor T1 and the gate terminal of the first transistor T1. As a result, during an activation period of the scan signal GW, a voltage obtained by adding the voltage difference (i.e., the threshold voltage) to a voltage of the data signal DATA supplied to the first terminal of the first transistor T1 may be supplied to the gate terminal of the first transistor T1. That is, the data signal DATA may be compensated by the threshold voltage of the first transistor T1 and the compensated data signal DATA may be supplied to the gate terminal of the first transistor T1.

The initialization voltage line to which the initialization voltage VINT is supplied may be connected to a first terminal of the fourth transistor T4_2 and a first terminal of the seventh transistor T7. The initialization voltage VINT may be output from a second terminal of the fourth transistor T4_1 and supplied to a first terminal of the storage capacitor CST during an activation period of the data initialization signal GI.

Each of the fourth transistors T4_1 and T4_2 may include a gate terminal, a first terminal, and a second terminal. In an embodiment, the fourth transistors T4_1 and T4_2 may be connected in series and may operate as a dual transistor, for example. In an embodiment, when the dual transistor is turned off, a leakage current may be reduced, for example. The first terminal of each of the fourth transistors T4_1 and T4_2 may receive the initialization voltage VINT during an activation period of the data initialization signal GI. The gate terminal of each of the fourth transistors T4_1 and T4_2 may receive the data initialization signal GI. The second terminal of the fourth transistor T4_1 may be connected to the gate terminal of the first transistor T1. In an embodiment, the first terminal of each of the fourth transistors T4_1 and T4_2 may be a source terminal and the second terminal of each of the fourth transistors T4_1 and T4_2 may be a drain terminal. In an alternative embodiment, the first terminal of each of the fourth transistors T4_1 and T4_2 may be a drain terminal and the second terminal of each of the fourth transistors T4_1 and T4_2 may be a source terminal.

Each of the fourth transistors T4_1 and T4_2 may supply the initialization voltage VINT to the gate terminal of the first transistor T1 during an activation period of the data initialization signal GI. In this case, each of the fourth transistors T4_1 and T4_2 may operate in a linear region. That is, each of the fourth transistors T4_1 and T4_2 may initialize the gate terminal of the first transistor T1 to the initialization voltage VINT during an activation period of the data initialization signal GI.

In an embodiment, the data initialization signal GI may be substantially the same as the scan signal GW before one horizontal time. In an embodiment, the data initialization signal GI supplied to a sub-pixel in an n-th row (where n is an integer greater than or equal to 2 and equal to or less than N) among plurality of sub-pixels may be substantially the same signal as the scan signal GW supplied to a sub-pixel in an (n−1)-th row among the sub-pixels, for example. That is, by supplying an activated scan signal GW to the sub-pixel in the (n−1)-th row, the activated data initialization signal GI may be supplied to the sub-pixel in the n-th row. As a result, the data signal DATA may be supplied to the sub-pixel of the (n−1)-th row among the sub-pixels, and the gate terminal of the first transistor T1 included in the sub-pixel of the n-th row among the sub-pixels may be initialized to the initialization voltage VINT.

The fifth transistor T5 may include a gate terminal, a first terminal, and a second terminal. The gate terminal may receive the emission control signal EM. The first terminal may be connected to the driving voltage line to which the driving voltage ELVDD is supplied. The second terminal may be connected to the first terminal of the first transistor T1. In an embodiment, the first terminal of the fifth transistor T5 may be a source terminal and the second terminal of the fifth transistor T5 may be a drain terminal. In an alternative embodiment, the first terminal of the fifth transistor T5 may be a drain terminal and the second terminal of the fifth transistor T5 may be a source terminal.

The fifth transistor T5 may supply the driving voltage ELVDD to the first terminal of the first transistor T1 during an activation period of the emission control signal EM. Conversely, the fifth transistor T5 may block a supply of the driving voltage ELVDD during an inactivation period of the emission control signal EM. In this case, the fifth transistor T5 may operate in a linear region. When the fifth transistor T5 supplies a driving voltage ELVDD to the first terminal of the first transistor T1 during an activation period of the emission control signal EM, the first transistor T1 may generate the driving current ID. In addition, when the fifth transistor T5 blocks a supply of the driving voltage ELVDD during an inactivation period of the emission control signal EM, the data signal DATA supplied to the first terminal of the first transistor T1 may supplied to the gate terminal of the first transistor T1.

The sixth transistor T6 may include a gate terminal, a first terminal, and a second terminal. The gate terminal of the sixth transistor T6 may receive the emission control signal EM. The first terminal of the sixth transistor T6 may be connected to the second terminal of the first transistor T1. The second terminal of the sixth transistor T6 may be connected to the first terminal of the organic light emitting diode OLED. In an embodiment, the first terminal of the sixth transistor T6 may be a source terminal and the second terminal of the sixth transistor T6 may be a drain terminal. In an alternative embodiment, the first terminal of the sixth transistor T6 may be a drain terminal and the second terminal of the sixth transistor T6 may be a source terminal.

The sixth transistor T6 may supply the driving current ID generated by the first transistor T1 to the organic light emitting diode OLED during an activation period of the emission control signal EM. In this case, the sixth transistor T6 may operate in a linear region. That is, when the sixth transistor T6 supplies the driving current ID generated by the first transistor T1 to the organic light emitting diode OLED during an activation period of the emission control signal EM, the organic light emitting diode OLED may output light. In addition, when sixth transistor T6 electrically separates the first transistor T1 and the organic light emitting diode OLED from each other during an activation period of the emission control signal EM, the data signal DATA (to be more precise, a data signal compensated for threshold voltage) supplied to the second terminal of the first transistor T1 may be supplied to the gate terminal of the first transistor T1.

The seventh transistor T7 may include a gate terminal, a first terminal, and a second terminal. The gate terminal of the seventh transistor T7 may receive the diode initialization signal GB. The first terminal of the seventh transistor T7 may receive the initialization voltage VINT. The second terminal of the seventh transistor T7 may be connected to the first terminal of the organic light emitting diode OLED. In an embodiment, the first terminal of the seventh transistor T7 may be a source terminal and the second terminal of the seventh transistor T7 may be a drain terminal. In an alternative embodiment, the first terminal of the seventh transistor T7 may be a drain terminal and the second terminal of the seventh transistor T7 may be a source terminal.

The seventh transistor T7 may supply the initialization voltage VINT to the first terminal of the organic light emitting diode OLED during an activation period of the diode initialization signal GB. In this case, the seventh transistor T7 may operate in a linear region. That is, the seventh transistor T7 may initialize the first terminal of the organic light emitting diode OLED to the initialization voltage VINT during an activation period of the diode initialization signal GB.

In an alternative embodiment, the data initialization signal GI and the diode initialization signal GB may be substantially the same signal as each other. An operation of initializing the gate terminal of the first transistor T1 and an operation of initializing the first terminal of the organic light emitting diode OLED may not affect each other. That is, the operation of initializing the gate terminal of the first transistor T1 and the operation of initializing the first terminal of the organic light emitting diode OLED may be independent of each other. Accordingly, the diode initialization signal GB may not be separately generated.

The storage capacitor CST may include a first terminal and a second terminal. The storage capacitor CST may be connected between the driving voltage line to which the driving voltage ELVDD is supplied and the gate terminal of the first transistor T1. In an embodiment, the first terminal of the storage capacitor CST may be connected to the gate terminal of the first transistor T1 and second terminal of the storage capacitor CST may be connected to the driving voltage line to which the driving voltage ELVDD is supplied, for example. The storage capacitor CST may maintain a voltage level of the gate terminal of the first transistor T1 during an inactivation period of the scan signal GW. The inactivation period of the scan signal GW may overlap an activation period of the emission control signal EM, and the driving current ID generated by the first transistor T1 may be supplied to the organic light emitting diode OLED during the activation period of the emission control signal EM. Accordingly, the driving current ID generated by the first transistor T1 based on a voltage level maintained by the storage capacitor CST may be supplied to the organic light emitting diode OLED.

Although each of the pixels PX of the invention has been described as including seven transistors and one storage capacitor, the configuration of the invention is not limited thereto. In an embodiment, each of the pixels PX may have a configuration including at least one transistor and at least on storage capacitor, for example.

Figure 3:
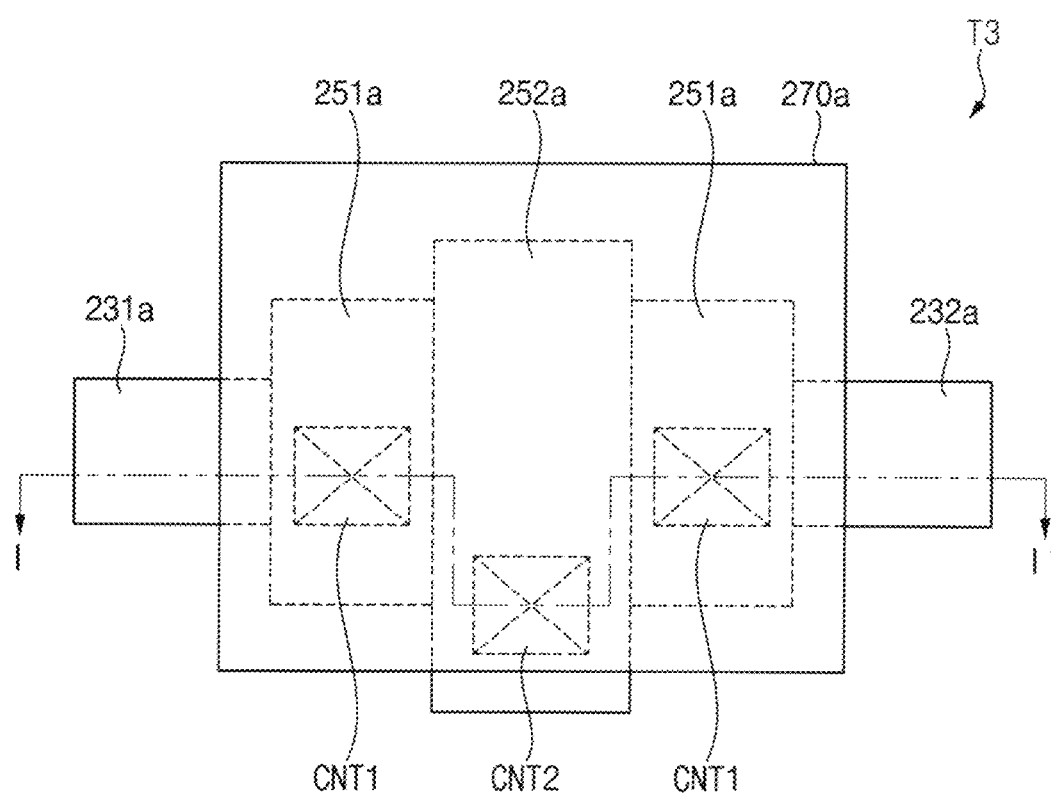
FIG. 3 is a plan view illustrating a transistor included in the pixel of FIG. 2.
Figure 4:
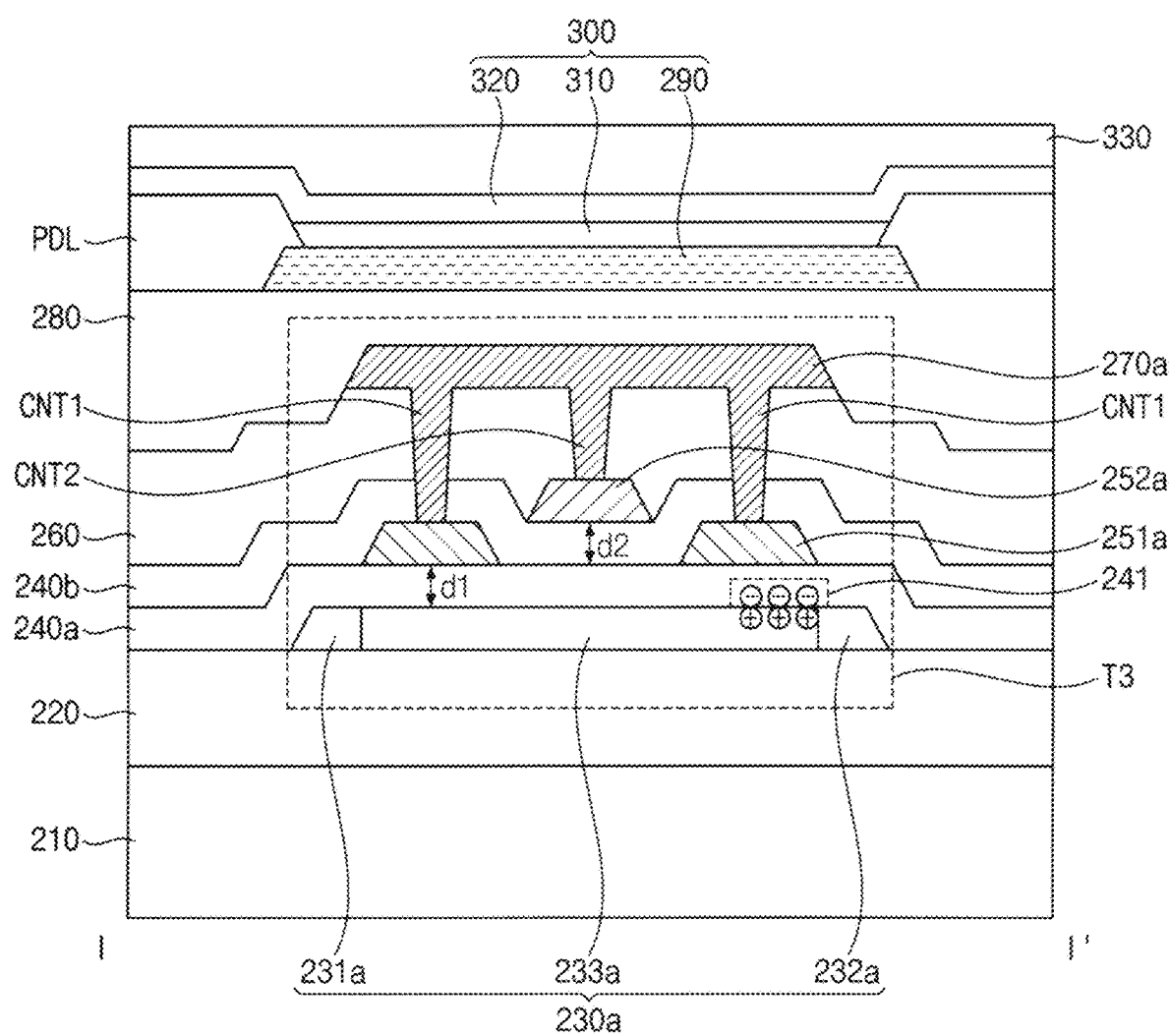
FIG. 4 is a cross-sectional view taken along line I-I' of FIG. 3.

FIG. 3 is a plan view illustrating a transistor included in the pixel of FIG. 2. FIG. 4 is a cross-sectional view taken along line I-I' of FIG. 3. In an embodiment, the transistor of FIGS. 3 and 4 may correspond to the third transistor T3 of FIG. 2, for example. In embodiment, the third transistor T3 may be defined as a switching transistor.

Referring to FIGS. 3 and 4, each of the pixels PX may include a substrate 210, a buffer layer 220, a first gate insulating layer 240a, a second gate insulating layer 240b, the third transistor T3, an inter-insulating layer 260, a planarization layer 280, a pixel defining layer PDL, a emission element 300, an encapsulation layer 330, or the like. The third transistor T3 may include a first active layer 230a, first gate electrodes 251a, a second gate electrode 252a, and a first connection electrode 270a. The emission element 300 may include a lower electrode 290, an emission layer 310, and an upper electrode 320.

The substrate 210 may include a transparent or opaque material. In an embodiment, the substrate 210 may include a flexible transparent resin substrate, for example. In an embodiment, the substrate 210 may include a polyimide substrate including a first polyimide layer, a first barrier layer, a second polyimide layer, a second barrier layer, or the like. In an alternative embodiment, the substrate 210 may include a quartz substrate, a synthetic quartz substrate, a calcium fluoride substrate, a soda lime glass substrate, an alkali-free glass substrate, or the like.

The buffer layer 220 may be disposed on the substrate 210. The buffer layer 220 may prevent diffusion of metal atoms or impurities from the substrate 210 to the transistor (e.g., the third transistor T3). In an embodiment, the buffer layer 220 may include an inorganic material such as oxide or nitride, for example.

The first active layer 230a may be disposed on the buffer layer 220. The first active layer 230a may include an oxide semiconductor, an inorganic semiconductor, or an organic semiconductor. In an embodiment, the first active layer 230a may include a silicon semiconductor. In an embodiment, the first active layer 230a may include polysilicon, for example.

The first active layer 230a may include a first source region 231a, a first drain region 232a, and a first channel region 233a. The first channel region 233a may be disposed between the first source region 231a and the first drain region 232a. In an embodiment, each of the first source region 231a and the first drain region 232a may be doped with P-type impurity ions. In an alternative embodiment, each of the first source region 231a and the first drain region 232a may be doped with N-type impurity ions.

The first gate insulating layer 240a may be disposed on the buffer layer 220 and the first active layer 230a. The first gate insulating layer 240a may cover the first active layer 230a and may be disposed along a profile of the first active layer 230a with a uniform thickness along a thickness direction (e.g., vertical direction in FIG. 4) perpendicular to a main extension direction of the substrate 210. In an alternative embodiment, the first gate insulating layer 240a may sufficiently cover the first active layer 230a and may have a substantially flat top surface without creating a step around the first active layer 230a. In an embodiment, the first gate insulating layer 240a may include silicon oxide (SiOx), silicon nitride (SiNx), or the like, for example. In an embodiment, the first gate insulating layer 240a may have a single-layer structure including silicon oxide. In an alternative embodiment, the first gate insulating layer 240a may have a multilayer structure including silicon oxide and silicon nitride.

Hereinafter, it is assumed that the first source region 231a and the first drain region 232a of the first active layer 230a are doped with P-type impurity ions.

A region of the first gate insulating layer 240a adjacent to the first drain region 232a may have a higher electron density than a region of the first gate insulating layer 240a adjacent to the first source region 231a. In an embodiment, a charge trap region 241 may exist in a region of the first gate insulating layer 240a adjacent to the first drain region 232a, for example. In the charge trap region 241, electrons having a fixed position by being trapped in a lattice of the first gate insulating layer 240a may exist.

The two first gate electrodes 251a may be disposed on the first gate insulating layer 240a. The first gate electrodes 251a may overlap the first channel region 233a of the first active layer 230a. In an embodiment, the first gate electrodes 251a may be disposed on opposite sides of the first channel region 233a on the substrate 210. In an embodiment, each of the first gate electrodes 251a may include a metal, an alloy, a metal nitride, a conductive metal oxide, a transparent conductive material, or the like, for example.

The second gate insulating layer 240b may be disposed on the first gate insulating layer 240a and the first gate electrodes 251a. The second gate insulating layer 240b may cover the first gate electrodes 251a and may be disposed along a profile of the first gate electrodes 251a to have a uniform thickness. In an alternative embodiment, the second gate insulating layer 240b may sufficiently cover the first gate electrodes 251a and may have a substantially flat top surface without creating a step around the first gate electrodes 251a. In an embodiment, the second gate insulating layer 240b may include silicon oxide, silicon nitride, or the like, for example. In an embodiment, the second gate insulating layer 240b may have a single-layer structure including silicon nitride.

In an embodiment, the second gate electrode 252a may be disposed on the second gate insulating layer 240b. The second gate electrode 252a may overlap the first channel region 233a of the first active layer 230a. In an embodiment, the second gate electrode 252a may be disposed on a central portion of the first channel region 233a on the substrate 210. In an embodiment, the second gate electrode 252a may include a metal, an alloy, a metal nitride, a conductive metal oxide, a transparent conductive material, or the like, for example.

In an embodiment, the second gate electrode 252a may not overlap the first gate electrodes 251a. In an alternative embodiment, the second gate electrode 252a may overlap at least a part of the first gate electrodes 251a. In an embodiment, each of the first gate electrodes 251a may be disposed adjacent to the first source region 231a or the first drain region 232a, for example.

In an embodiment, a thickness of the first gate insulating layer 240a may be greater than a thickness of the second gate insulating layer 240b. In an alternative embodiment, the thickness of the first gate insulating layer 240a may be a same as the thickness of the second gate insulating layer 240b. Here, the thickness of the first gate insulating layer 240a may be defined as a first thickness d1 and the thickness of the second gate insulating layer 240b may be defined as the second thickness d2. In an embodiment, the first thickness d1 may be about 800 angstroms (Å) to about 1,200 Å and the second thickness d2 may be about 500 Å to about 800 Å, for example. In other words, a shortest distance between the first active layer 230a and the first gate electrodes 251a may be smaller than a shortest distance between the first active layer 230a and the second gate electrode 252a.

As will be described later, when the first thickness d1 and the second thickness d2 satisfy the above conditions, an electric field generated by the charge trap region 241 may be strengthened, and aging of the third transistor T3 may be strengthened.

In an embodiment, a same signal may be applied to the first and second gate electrodes 251a and 252a. In an embodiment, the scan signal GW shown in FIG. 2 may be applied to the first and second gate electrodes 251a and 252a, for example.

The inter-insulating layer 260 may be disposed on the second gate insulating layer 240b and the second gate electrode 252a. The inter-insulating layer 260 may cover the second gate electrodes 252a and may be disposed along a profile of the second gate electrode 252a with a uniform thickness. In an alternative embodiment, the inter-insulating layer 260 may sufficiently cover the second gate electrodes 252a and may have a substantially flat top surface without creating a step around the second gate electrodes 252a. In an embodiment, the inter-insulating layer 260 may include silicon oxide, silicon nitride, or the like, for example. In an embodiment, the inter-insulating layer 260 may have a multilayer structure including silicon oxide and silicon nitride.

The first connection electrode 270a may be disposed on the inter-insulating layer 260. In an embodiment, the first connection electrode 270a may connect the first and second gate electrodes 251a and 252a. In other words, the first connection electrode 270a may be connected to the first gate electrodes 251a respectively through first contact holes CNT1 defined by removing the second gate insulating layer 240b and the inter-insulating layer 260. In addition, the first connection electrode 270a may be connected to the second gate electrode 252a through a second contact hole CNT2 defined by removing a part of the inter-insulating layer 260. In an embodiment, the first connection electrode 270a may include a metal, an alloy, a metal nitride, a conductive metal oxide, a transparent conductive material, or the like, for example.

The planarization layer 280 may be disposed on the inter-insulating layer 260 and the first connection electrode 270a. The planarization layer 280 may sufficiently cover the first connection electrode 270a. The planarization layer 280 may include an organic material or an inorganic material. In an embodiment, the planarization layer 280 may include an organic material such as a polyimide-based resin, a photoresist, an acrylic resin, a polyamide-based resin, a siloxane-based resin, or the like, for example.

The lower electrode 290 may be disposed on the planarization layer 280. The lower electrode 290 may be electrically connected to a drain electrode of the sixth transistor T6 shown in FIG. 2. In an embodiment, the lower electrode 290 may include a conductive material such as a metal, a transparent conductive oxide, or the like, for example.

The pixel defining layer PDL may be disposed on the planarization layer 280. An opening exposing a part of the lower electrode 290 may be defined in the pixel defining layer PDL. In an embodiment, the pixel defining layer PDL may include an organic material such as polyimide, for example.

The emission layer 310 may be disposed on the lower electrode 290. The emission layer 310 may be disposed on the lower electrode 290 exposed by the opening. The emission layer 310 may have a multilayer structure including an organic emission layer, a hole injection layer, a hole transport layer, an electron transport layer, an electron injection layer, or the like. The organic emission layer may be formed or provided using at least one of emission materials capable of emitting red light, green light, blue light, or the like. In an alternative embodiment, the organic light emitting layer may emit white light as a whole by stacking a plurality of light emitting materials capable of generating light of different colors such as red light, green light, and blue light.

The upper electrode 320 may be disposed on the pixel defining layer PDL and the emission layer 310. That is, the upper electrode 320 may be entirely disposed on the display unit 110 shown in FIG. 1. In an embodiment, the upper electrode 320 may include a conductive material such as a metal, a transparent conductive oxide, or the like, for example.

The encapsulation layer 330 may be disposed on the upper electrode 320. The encapsulation layer 330 may include at least one inorganic layer and at least one organic layer. In an embodiment, the inorganic layer may include silicon oxide, silicon nitride, or the like, for example. The organic layer may include a cured polymer such as polyacrylate ("PAR").

Hereinafter, an aging method of the third transistor T3 will be described.

When the transistor is continuously used, characteristics of the transistor may be rapidly changed during an initial predetermined period. Even when the transistor is continuously used, the characteristics of the transistor may hardly change after a predetermined period of time.

An aging process is a process for preventing a change in characteristics of the transistor even when a user uses a display device by applying stress to the transistor in advance in the manufacturing stage of the display device.

In an embodiment, the aging method of the third transistor T3 may be performed by applying a bias voltage higher than a bias voltage of the first drain region 232a to the first gate electrode 251a disposed adjacent to the first drain region 232a. In an embodiment, the bias voltage of about 15 volts (V) to about 30V may be applied to the first gate electrode 251a disposed adjacent to the first drain region 232a, for example. Thereafter, electrons may be trapped in the lattice of the first gate insulating layer 240a and the charge trap region 241 may be formed or provided. Accordingly, when the electric field generated by the charge trap region 241 partially offsets the electric field between a gate electrode and a drain electrode of the third transistor T3, the leakage current may be reduced.

Although the aging process described with reference to FIG. 4 is a case in which the first active layer 230a is doped with P-type impurity ions, a same principle may be applied even when the first active layer 230a is doped with N-type impurity ions.

In an embodiment, when the first active layer 230a is doped with N-type impurity ions, for example, the aging method of the third transistor T3 may be performed by applying a bias voltage lower than a bias voltage of the first drain region 232a to the first gate electrode 251a disposed adjacent to the first drain region 232a. Accordingly, holes may be trapped in the lattice of the first gate insulating layer 240a and the charge trap region 241 may be formed or provided.

In this case, a region of the first gate insulating layer 240a adjacent to the first drain region 232a may have a higher hole density than a region of the first gate insulating layer 240a adjacent to the first source region 231a.

A conventional display device may not apply a voltage directly to the drain electrode of the third transistor, so aging the third transistor is difficult.

The third transistor T3 of the display device 1000 in an embodiment may include the first active layer 230a including the first channel region 233a, the two first gate electrodes 251a disposed on the first active layer 230a and overlapping the first channel region 233a, the second gate electrode 252a disposed on the first gate electrodes 251a and overlapping the first channel region 233a, and the first connection electrode 270a disposed on the second gate electrode 252a and connecting the first and second gate electrodes 251a and 252a. Accordingly, the aging of the third transistor T3 may be strengthened, and the leakage current flowing through the third transistor T3 may be reduced.

The aging process of a same principle as described above may be applied to the transistors (e.g., the first transistor T1, the third transistor T3, and the fourth transistor T4) described below.

Figure 5:
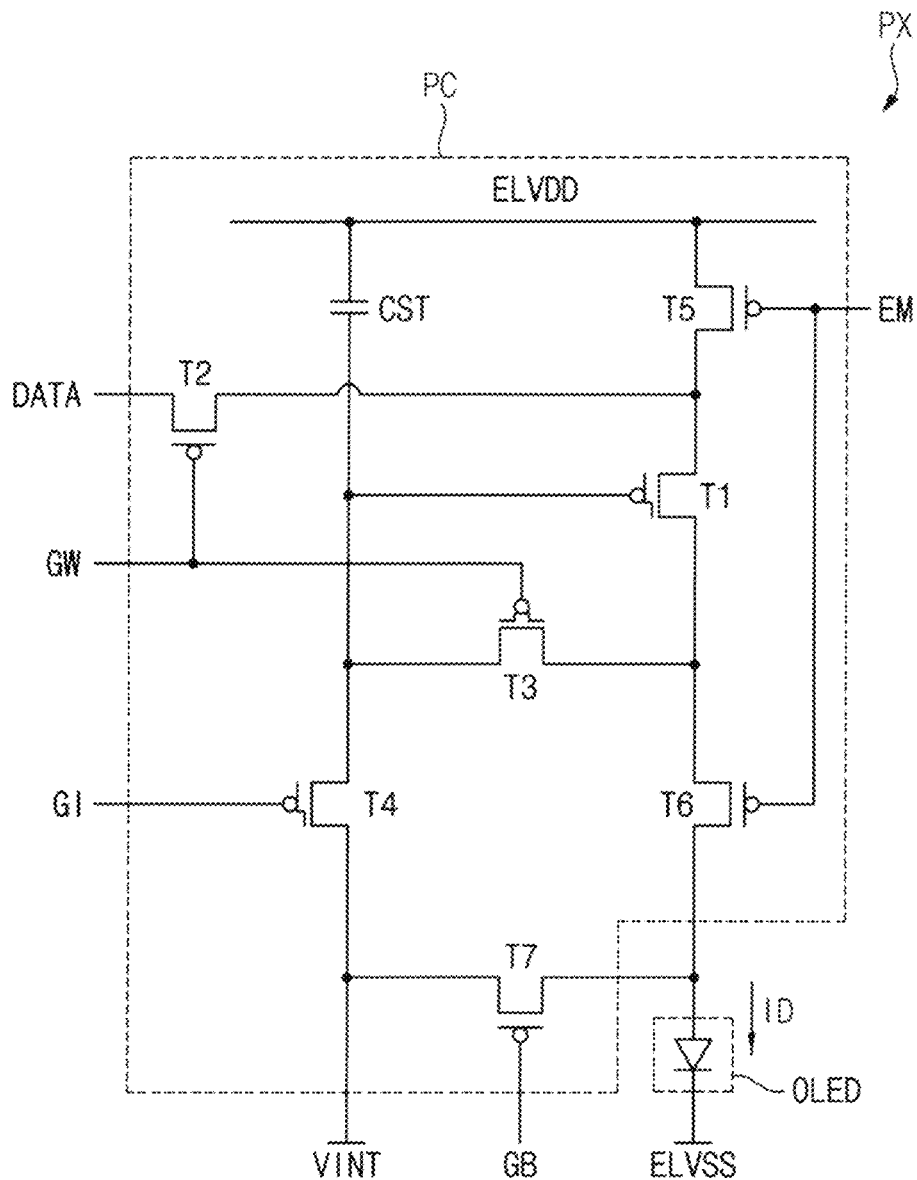
FIG. 5 is a circuit diagram illustrating another embodiment of a pixel disposed in a display portion of a display device.

FIG. 5 is a circuit diagram illustrating another embodiment of a pixel disposed in a display portion of a display device. In an embodiment, each of the pixels PX may include an emission element (e.g., the organic light emitting diode OLED) and the pixel circuit PC for driving the emission element, for example.

Referring to FIG. 5, the pixel circuit PC may include the first to seventh transistors T1, T2, T3, T4, T5, T6, and T7, the storage capacitor CST, the driving voltage line to which the driving voltage ELVDD is supplied, the common voltage line to which the common voltage ELVSS is supplied, the initialization voltage line to which the initialization voltage VINT is supplied, the data signal line to which the data signal DATA is supplied, the scan signal line to which the a scan signal GW is supplied, the data initialization signal line to which the data initialization signal GI is supplied, the emission control signal line to which the emission control signal EM is supplied, the diode initialization signal line to which the diode initialization signal GB is supplied, or the like. The pixel PX of FIG. 5 may be substantially the same as or similar to the pixel PX described with reference to FIG. 2 except for the structures of the first transistor T1 and the fourth transistor T4. Hereinafter, overlapping description will be omitted.

As will be described later, the first transistor T1 shown in FIG. 5 may be substantially the same as or similar to the first transistor T1 shown in FIG. 2 except for a cross-sectional structure. In addition, the fourth transistor T4 shown in FIG. 5 may operate as a single transistor, unlike the fourth transistors T4_1 and T4_2 shown in FIG. 2.

Figure 6:
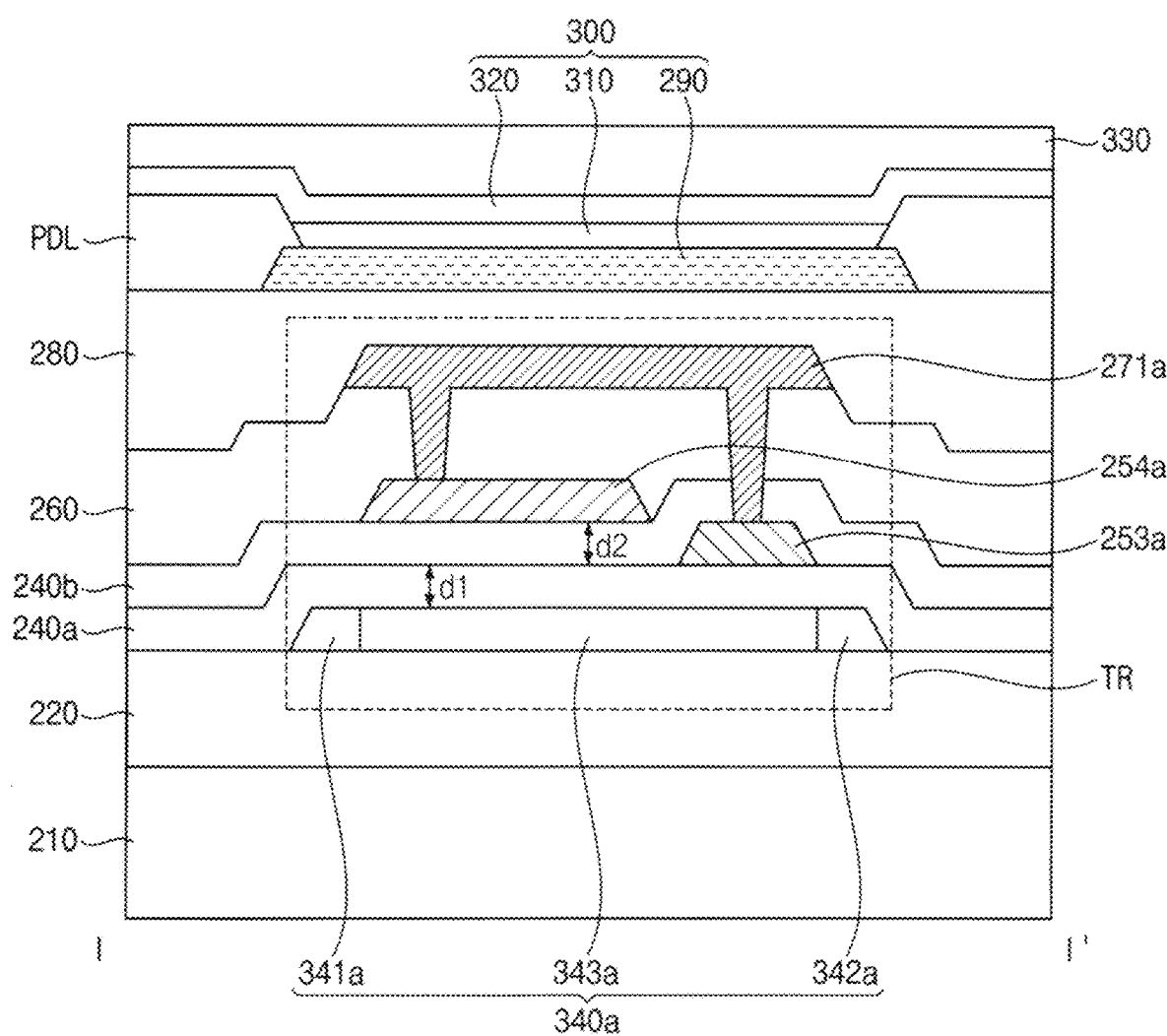
FIG. 6 is a cross-sectional view illustrating a transistor and an emission element included in the pixel of FIG. 5.

FIG. 6 is a cross-sectional view illustrating a transistor and an emission element included in the pixel of FIG. 5. In an embodiment, a transistor TR of FIG. 6 may correspond to the first transistor T1 or the fourth transistor T4 shown in FIG. 5, for example. The first transistor T1 may be a driving transistor and the fourth transistor T4 may be a switching transistor.

Referring to FIGS. 5 and 6, each of the pixels PX may include the substrate 210, the buffer layer 220, the first gate insulating layer 240a, the second gate insulating layer 240b, the transistor TR, the inter-insulating layer 260, the planarization layer 280, the pixel defining layer PDL, the emission element 300, the encapsulation layer 330, or the like. The transistor TR may include a second active layer 340a, a third gate electrode 253a, a fourth gate electrode 254a, and a second connection electrode 271a. The emission element 300 may include the lower electrode 290, the emission layer 310 and the upper electrode 320. The pixel PX described with reference to FIG. 6 may be substantially the same as or similar to the pixel PX described with reference to FIG. 4 except for a structure of the transistor TR. Hereinafter, overlapping description will be omitted.

The second active layer 340a may be disposed on the buffer layer 220. The second active layer 340a may include an oxide semiconductor, an inorganic semiconductor, or an organic semiconductor. In an embodiment, the second active layer 340a may include a silicon semiconductor. In an embodiment, the second active layer 340a may include polysilicon, for example.

The second active layer 340a may include a second source region 341a, a second drain region 342a, and a second channel region 343a. The second channel region 343a may be disposed between the second source region 341a and the second drain region 342a. In an embodiment, each of the second source region 341a and the second drain region 342a may be doped with P-type impurity ions. In an alternative embodiment, each of the second source region 341a and the second drain region 342a may be doped with N-type impurity ions.

The third gate electrode 253a may be disposed on the first gate insulating layer 240a. The third gate electrode 253a may overlap the second channel region 343a of the second active layer 340a. In an embodiment, the third gate electrode 253a may be disposed on a first side of the second channel region 343a on the substrate 210. In an embodiment, the third gate electrode 253a may include a metal, an alloy, a metal nitride, a conductive metal oxide, a transparent conductive material, or the like, for example.

The fourth gate electrode 254a may be disposed on the second gate insulating layer 240b. The fourth gate electrode 254a may overlap the second channel region 343a of the second active layer 340a. In an embodiment, the fourth gate electrode 254a may be disposed on a second side of the second channel region 343a on the substrate 210. In an embodiment, the fourth gate electrode 254a may include a metal, an alloy, a metal nitride, a conductive metal oxide, a transparent conductive material, or the like, for example.

In an embodiment, the fourth gate electrode 254a may not overlap the third gate electrode 253a. In an alternative embodiment, the fourth gate electrode 254a may overlap at least a part of the third gate electrode 253a. In an embodiment, the third gate electrode 253a and the fourth gate electrode 254a may be disposed adjacent to each other, for example. That is, the third gate electrode 253a may be disposed adjacent to the second drain region 342a of the second active layer 340a, and the fourth gate electrode 254a may be disposed adjacent to the first source region 341a of the second active layer 340a.

The second connection electrode 271a may be disposed on the inter-insulating layer 260. In an embodiment, the second connection electrode 271a may connect the third and fourth gate electrodes 253a and 254a. That is, the second connection electrode 271a may be connected to the third gate electrode 253a through a contact hole defined by removing the second gate insulating layer 240b and the inter-insulating layer 260. In addition, the second connection electrode 271a may be connected to the fourth gate electrode 254a through a contact hole defined by removing a part of the inter-insulating layer 260. In an embodiment, the second connection electrode 271a may include a metal, an alloy, a metal nitride, a conductive metal oxide, a transparent conductive material, or the like, for example.

Figure 7:
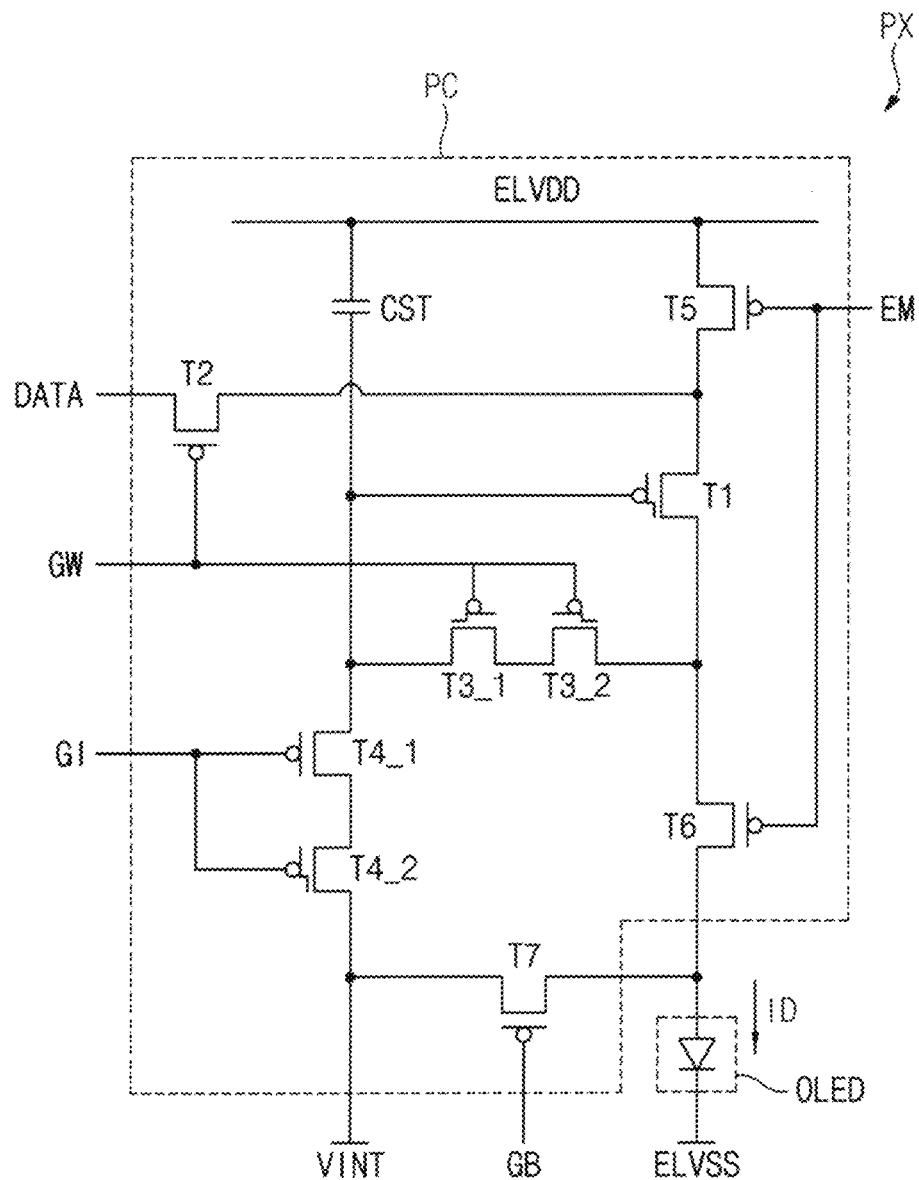
FIG. 7 is a circuit diagram illustrating another embodiment of a pixel disposed in a display portion of a display device.

FIG. 7 is a circuit diagram illustrating another embodiment of a pixel disposed in a display portion of a display device. In an embodiment, the pixel PX of FIG. 7 may include an emission element (e.g., the organic light emitting diode OLED) and the pixel circuit PC for driving the emission element, for example.

Referring to FIG. 7, the pixel circuit PC may include the first to seventh transistors T1, T2, T3_1, T3_2, T4_1, T4_2, T5, T6, and T7, the storage capacitor CST, the driving voltage line to which the driving voltage ELVDD is supplied, the common voltage line to which the common voltage ELVSS is supplied, the initialization voltage line to which the initialization voltage VINT is supplied, the data signal line to which the data signal DATA is supplied, the scan signal line to which the scan signal GW is supplied, the data initialization signal line to which the data initialization signal GI is supplied, the emission control signal line to which the emission control signal EM is supplied, the diode initialization signal line to which the diode initialization signal GB is supplied, or the like. The pixel PX described with reference to FIG. 7 may be substantially the same as or similar to the pixel PX described with reference to FIGS. 2 and 5 except for the structures of the third transistors T3_1 and T3_2 and the fourth transistors T4_1 and T4_2. Hereinafter, overlapping description will be omitted.

The third transistors T3_1 and T3_2 shown in FIG. 7 may operate as a dual transistor unlike the third transistor T3 shown in FIGS. 2 and 5. In an embodiment, when the dual transistor is turned off, a leakage current may be reduced, for example. In addition, the fourth transistors T4_1 and T4_2 shown in FIG. 7 may be substantially the same as or similar to the fourth transistors T4_1 and T4_2 shown in FIG. 2 except for a cross-sectional structure.

Figure 8:
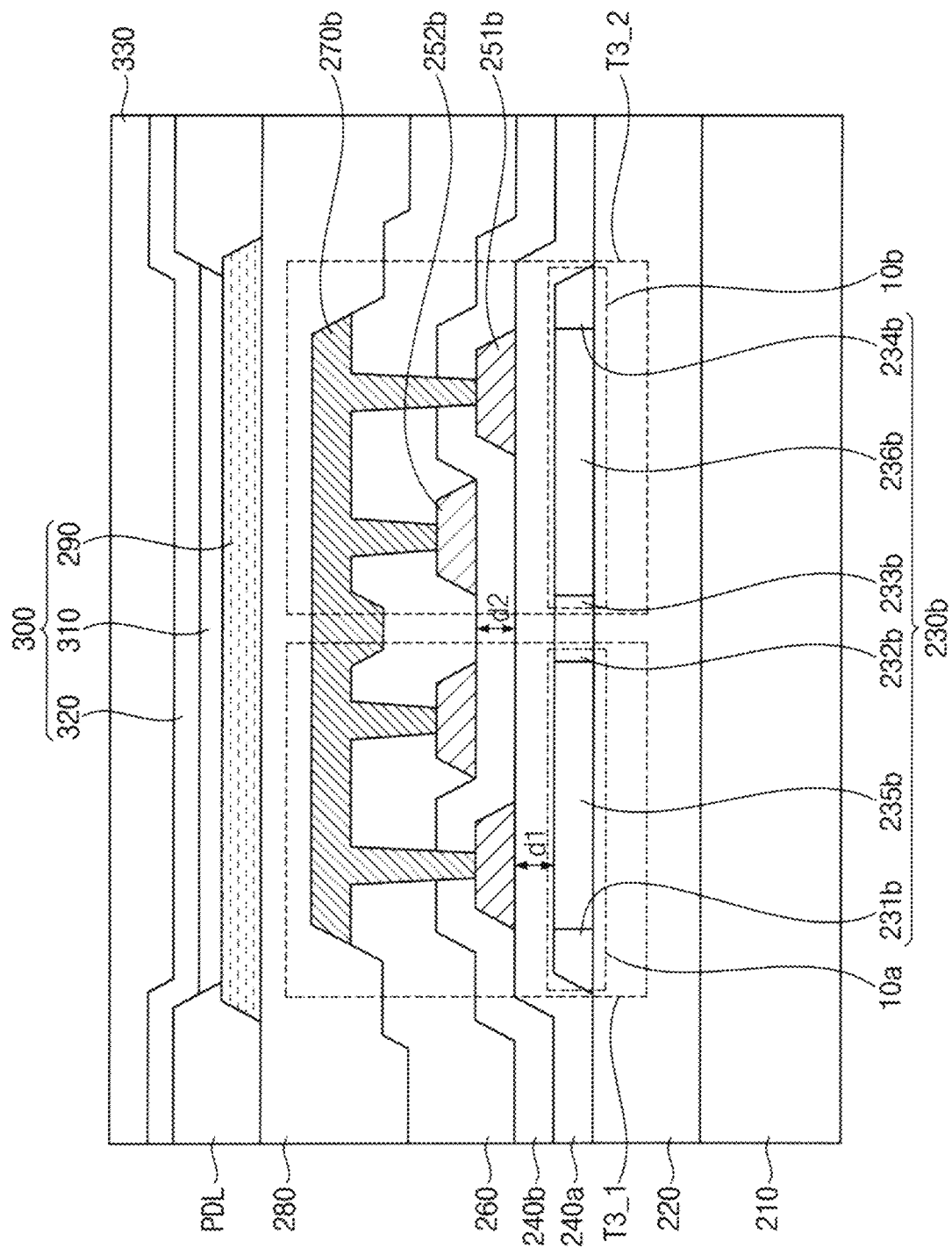
FIG. 8 is a cross-sectional view illustrating a transistor and an emission element included in the pixel of FIG. 7.
Figure 9:
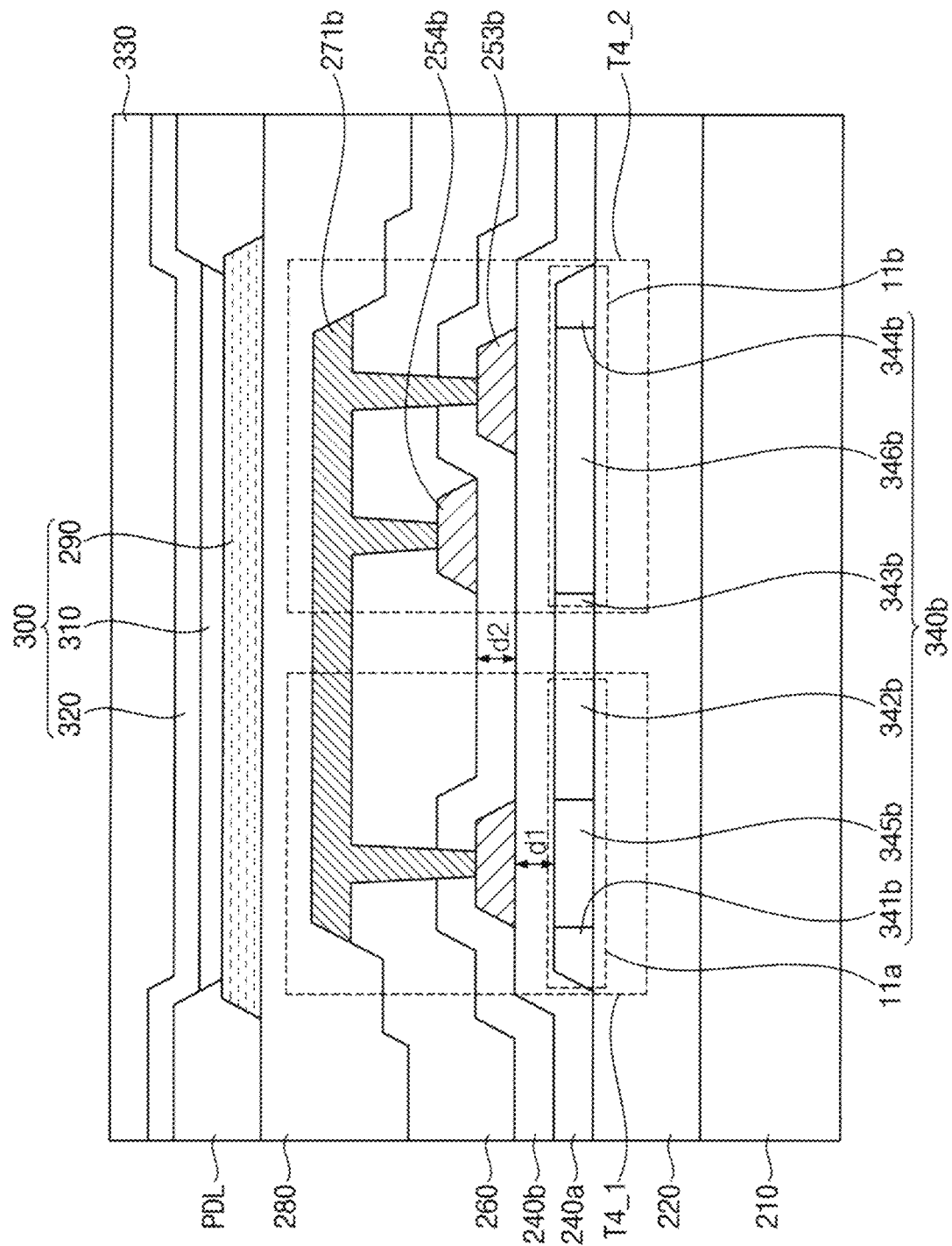
FIG. 9 is a cross-sectional view illustrating a transistor and an emission element included in the pixel of FIG. 7.

FIG. 8 is a cross-sectional view illustrating a transistor and an emission element included in the pixel of FIG. 7. FIG. 9 is a cross-sectional view illustrating a transistor and an emission element included in the pixel of FIG. 7. In an embodiment, the transistor of FIG. 8 may correspond to the third transistors T3_1 and T3_2 shown in FIG. 7 and the transistor of FIG. 9 may correspond to the fourth transistors T4_1 and T4_2 shown in FIG. 7, for example.

Referring to FIGS. 7 to 9, each of the pixels PX may include the substrate 210, the buffer layer 220, the first gate insulating layer 240a, the second gate insulating layer 240b, the third transistors T3_1 and T3_2, the fourth transistors T4_1 and T4_2, the inter-insulating layer 260, the planarization layer 280, the pixel defining layer PDL, the emission element 300, the encapsulation layer 330, or the like. The third transistors T3_1 and T3_2 may include a first active layer 230b, first gate electrodes 251b, second gate electrodes 252b, and a first connection electrode 270b, and a fourth transistor T4_1 and T4_2 may include a second active layer 340b, first gate electrodes 253b, a second gate electrode 254b, and a second connection electrode 271b. In addition, the emission element 300 may include the lower electrode 290, the emission layer 310, and the upper electrode 320. The pixel PX described with reference to FIGS. 8 and 9 may be substantially the same as or similar to the pixel PX described with reference to FIGS. 4 and 6 except for the structures of the third transistors T3_1 and T3_2 and the fourth transistors T4_1 and T4_2. Hereinafter, overlapping description will be omitted.

Referring to FIG. 8, the first active layer 230b may be disposed on the buffer layer 220. The first active layer 230b may include an oxide semiconductor, an inorganic semiconductor, or an organic semiconductor. In an embodiment, the first active layer 230b may include a silicon semiconductor. In an embodiment, the first active layer 230b may include polysilicon, for example.

The first active layer 230b may include a first active region 10a and a second active region 10b. The first active region 10a may include a first source region 231b, a first drain region 232b, and a first channel region 235b. In addition, the second active region 10b may include a second source region 233b, a second drain region 234b, and a second channel region 236b. In an embodiment, the first drain region 232b of the first active region 10a may extend to the second source region 233b of the second active region 10b, for example.

In an embodiment, the first and second source regions 231b and 233b and the first and second drain regions 232b and 234b may be doped with P-type impurity ions. In an alternative embodiment, the first and second source regions 231b and 233b and the first and second drain regions 232b and 234b may be doped with N-type impurity ions.

The two first gate electrodes 251b may be disposed on the first gate insulating layer 240a. In an embodiment, the first gate electrodes 251b may overlap the first active region 10a and the second active region 10b, respectively. In other words, the first gate electrodes 251b may overlap the first channel region 235b of the first active region 10a and the second channel region 236b of the second active region 10b, respectively. In an embodiment, each of the first gate electrodes 251b may include a metal, an alloy, a metal nitride, a conductive metal oxide, a transparent conductive material, or the like, for example.

The two second gate electrodes 252b may be disposed on the second gate insulating layer 240b. In an embodiment, the second gate electrodes 252b may overlap the first active region 10a and the second active region 10b, respectively. In other words, the second gate electrodes 252b may overlap the first channel region 235b of the first active region 10a and the second channel region 236b of the second active region 10b, respectively. In an embodiment, each of the second gate electrodes 252b may include a metal, an alloy, a metal nitride, a conductive metal oxide, a transparent conductive material, or the like, for example.

In an embodiment, the second gate electrodes 252b may not overlap the first gate electrodes 251b. In an alternative embodiment, the second gate electrodes 252b may overlap at least a part of the first gate electrodes 251b. In an embodiment, the second gate electrodes 252b may be disposed between the first gate electrodes 251b, for example. That is, each of the first gate electrodes 251b may be disposed adjacent to the first source region 231b or the second drain region 234b, and each of the second gate electrodes 252b may be disposed adjacent to the first drain region 232b or the second source region 233b.

In an embodiment, a same signal may be applied to the first and second gate electrodes 251b and 252b. In an embodiment, the scan signal GW shown in FIG. 7 may be applied to the first and second gate electrodes 251b and 252b, for example.

The first connection electrode 270b may be disposed on the inter-insulating layer 260. In an embodiment, the first connection electrode 270b may connect the first and second gate electrodes 251b and 252b to each other. That is, the first connection electrode 270b may be connected to the first gate electrodes 251b respectively through contact holes defined by removing the second gate insulating layer 240b and the inter-insulating layer 260. In addition, the first connection electrode 270b may be connected to the second gate electrodes 252b respectively through contact holes defined by removing a part of the inter-insulating layer 260. In an embodiment, the first connection electrode 270b may include a metal, an alloy, a metal nitride, a conductive metal oxide, a transparent conductive material, or the like, for example.

In an embodiment, the first active layer 230b, the first gate electrodes 251b, the second gate electrodes 252b, and the first connection electrode 270b may be defined as a first dual transistor in which two transistors are connected in series. That is, the first dual transistor may correspond to the third transistors T3_1 and T3_2 shown in FIG. 7. In an embodiment, a 3-1 transistor T3_1 may be formed or provided by the first active region 10a of the first active layer 230b and a 3-2 transistor T3_2 may be formed or provided by the second active region 10b of the first active layer 230b, for example.

Referring to FIG. 9, the second active layer 340b may be disposed on the buffer layer 220. The second active layer 340b may include an inorganic semiconductor, an organic semiconductor, or an oxide semiconductor. In an embodiment, the second active layer 340b may include a silicon semiconductor. In an embodiment, the second active layer 340b may include polysilicon, for example.

The second active layer 340b may include a third active region 11a and a fourth active region 11b. The third active region 11a may include a third source region 341b, a third drain region 342b, and a third channel region 345b. In addition, the fourth active region 11b may include a fourth source region 343b, a fourth drain region 344b, and a fourth channel region 346b. In an embodiment, the third drain region 342b of the third active region 11a may extend to the fourth source region 343b of the fourth active region 11b, for example. In an embodiment, the third and fourth source regions 341b and 343b and the third and fourth drain regions 342b and 344b may be doped with P-type impurity ions. In an alternative embodiment, the third and fourth source regions 341b and 343b and the third and fourth drain regions 342b and 344b may be doped with N-type impurity ions.

The two third gate electrodes 253b may be disposed on the first gate insulating layer 240a. In an embodiment, the third gate electrodes 253b may overlap the third active region 11a and the fourth active region 11b, respectively. In other words, the third gate electrodes 253b may overlap the third channel region 345b of the third active region 11a and the fourth channel region 346b of the fourth active region 11b, respectively. In an embodiment, each of the third gate electrodes 253b may include a metal, an alloy, a metal nitride, a conductive metal oxide, a transparent conductive material, or the like, for example.

The fourth gate electrode 254b may be disposed on the second gate insulating layer 240b. In an embodiment, the fourth gate electrode 254b may overlap the fourth active region 11b. In other words, the fourth gate electrode 254b may overlap the fourth channel region 346b of the fourth active region 11b. In an embodiment, each of the fourth gate electrodes 254b may include a metal, an alloy, a metal nitride, a conductive metal oxide, a transparent conductive material, or the like, for example.

In an embodiment, the fourth gate electrode 254b may not overlap the third gate electrodes 253b. In an alternative embodiment, the fourth gate electrode 254b may overlap at least a part of the third gate electrodes 253b. In an embodiment, the fourth gate electrode 254b may be disposed between the third gate electrodes 253b, for example. That is, each of the third gate electrodes 253b may be disposed adjacent to the third source region 341b or the fourth drain region 344b, and the fourth gate electrode 254b may be disposed adjacent to the fourth source region 343b.

The second connection electrode 271b may be disposed on the inter-insulating layer 260. In an embodiment, the second connection electrode 271b may connect the third and fourth gate electrodes 253b and 254b to each other. That is, the second connection electrode 271b may be connected to the third gate electrodes 253b respectively through contact holes defined by removing the second gate insulating layer 240b and the inter-insulating layer 260. In addition, the second connection electrode 271b may be connected to the fourth gate electrode 254b through a contact hole defined by removing a part of the inter-insulating layer 260. In an embodiment, the second connection electrode 271b may include a metal, an alloy, a metal nitride, a conductive metal oxide, a transparent conductive material, or the like, for example.

In an embodiment, the second active layer 340b, the third gate electrodes 253b, the fourth gate electrodes 254b, and the second connection electrode 271b may be defined as a second dual transistor in which two transistors are connected in series. That is, the second dual transistor may correspond to the fourth transistors T4_1 and T4_2 shown in FIG. 7. In an embodiment, a 4-1 transistor T4_1 may be formed or provided by the third active region 11a of the second active layer 340b and a 4-2 transistor T4_2 may be formed or provided by the fourth active region 11b of the second active layer 340b, for example.

Figure 10:
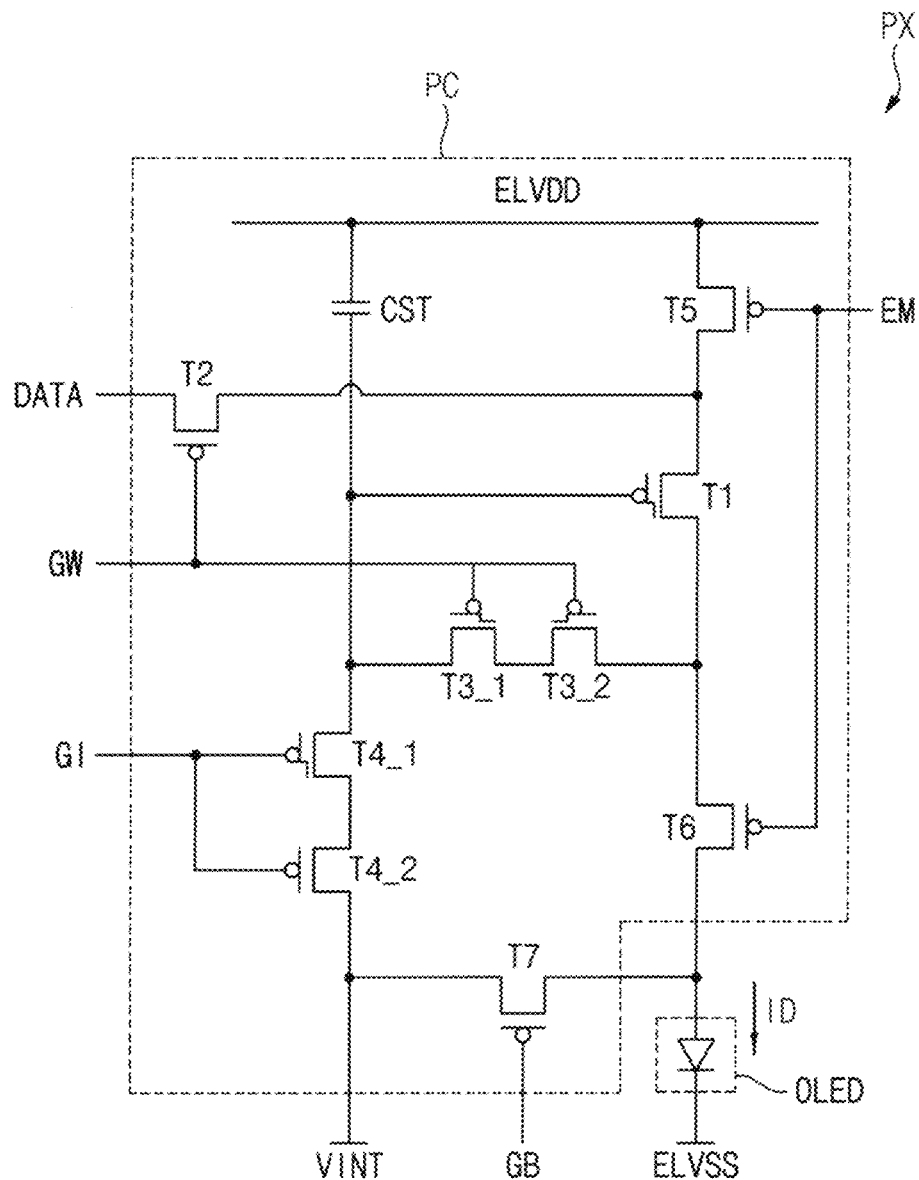
FIG. 10 is a circuit diagram illustrating another embodiment of a pixel disposed in a display portion of a display device.

FIG. 10 is a circuit diagram illustrating another embodiment of a pixel disposed in a display portion of a display device. In an embodiment, the pixel PX of FIG. 10 may include an emission element (e.g., the organic light emitting diode OLED) and the pixel circuit PC for driving the emission element, for example.

Referring to FIG. 10, the pixel circuit PC may include the first to seventh transistors T1, T2, T3_1, T3_2, T4_1, T4_2, T5, T6, and T7, the storage capacitor CST, the driving voltage line to which the driving voltage ELVDD is supplied, the common voltage line to which the common voltage ELVSS is supplied, the initialization voltage line to which the initialization voltage VINT is supplied, the data signal DATA line, the scan signal line to which the scan signal GW is supplied, the data initialization signal line to which the data initialization signal GI is supplied, the emission control signal line to which the emission control signal EM is supplied, the diode initialization signal line to which the diode initialization signal GB is supplied, or the like. The pixel PX described with reference to FIG. 10 may be substantially the same as or similar to the pixel PX described with reference to FIGS. 2, 5 and 7 except for the structures of the third transistors T3_1 and T3_2 and the fourth transistors T4_1 and T4_2. Hereinafter, overlapping description will be omitted.

The third transistors T3_1 and T3_2 shown in FIG. 10 may be substantially the same as or similar to the third transistors T3_1 and T3_2 shown in FIG. 7 except for a cross-sectional structure. In addition, the fourth transistors T4_1 and T4_2 shown in FIG. 10 may be substantially the same as or similar to the fourth transistors T4_1 and T4_2 shown in FIG. 7 except for a cross-sectional structure.

Figure 11:
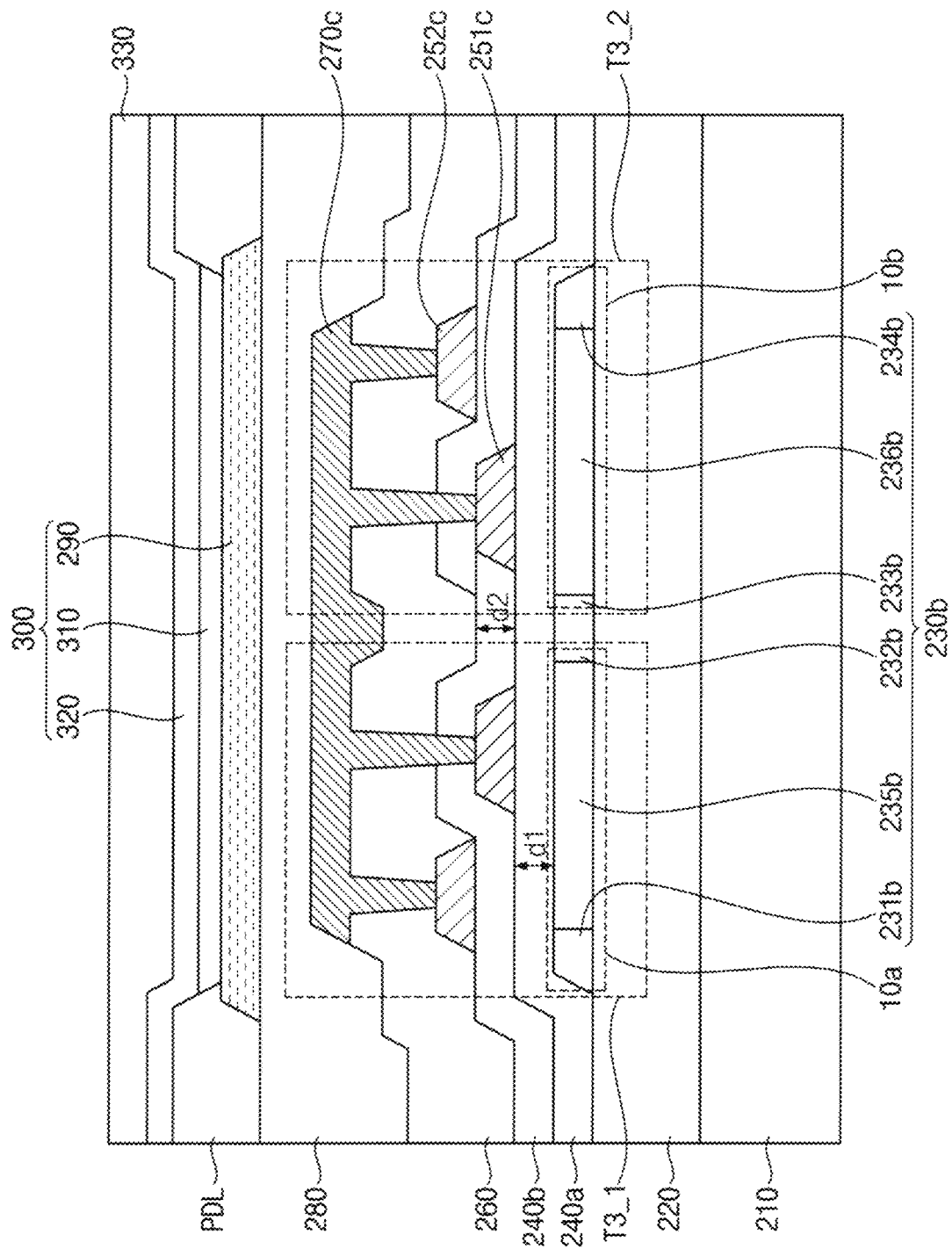
FIG. 11 is a cross-sectional view illustrating a transistor and an emission element included in the pixel of FIG. 10.
Figure 12:
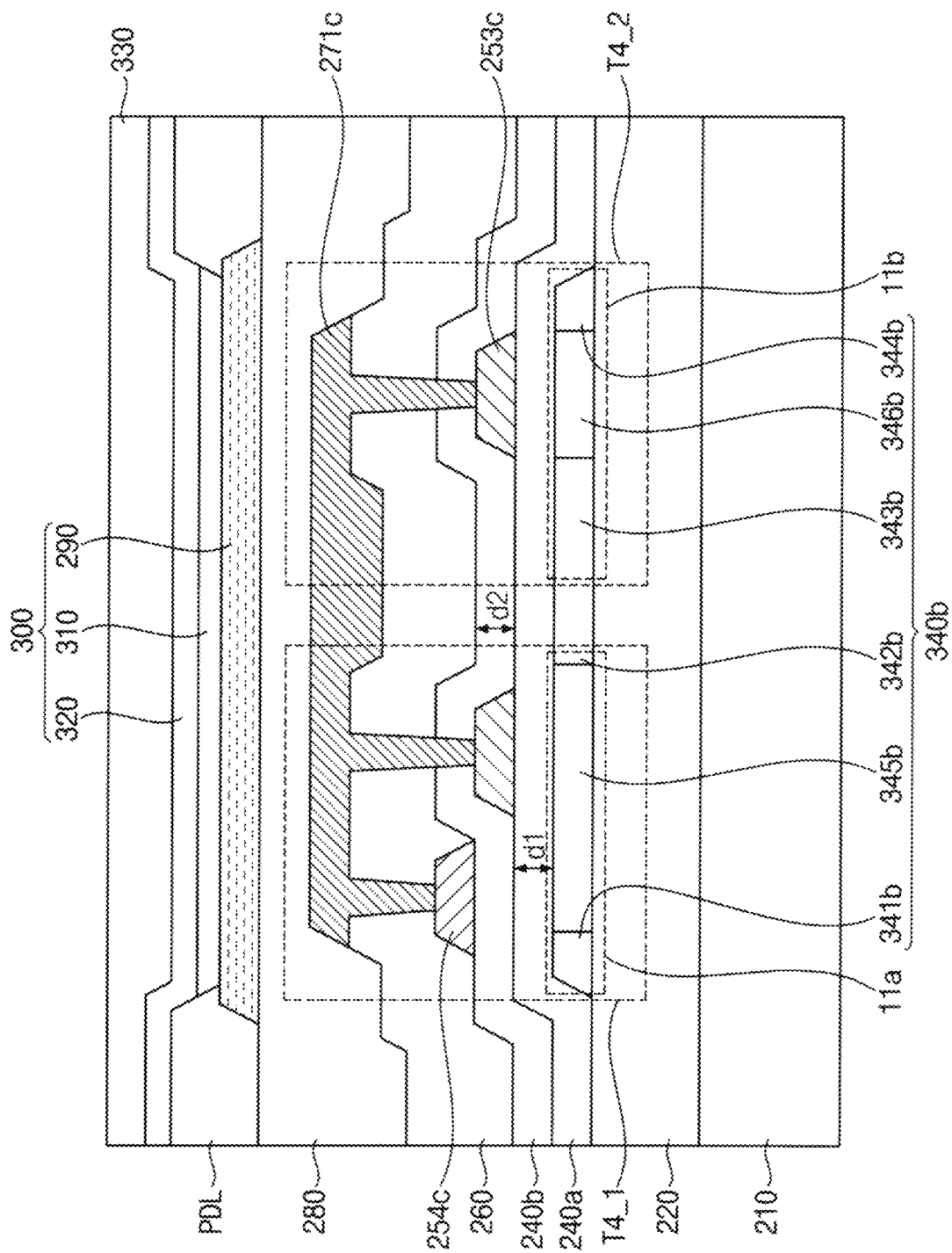
FIG. 12 is a cross-sectional view illustrating a transistor and an emission element included in the pixel of FIG. 10.

FIG. 11 is a cross-sectional view illustrating a transistor and an emission element included in the pixel of FIG. 10. FIG. 12 is a cross-sectional view illustrating a transistor and an emission element included in the pixel of FIG. 10. In an embodiment, the transistor of FIG. 11 may correspond to the third transistors T3_1 and T3_2 shown in FIG. 10, and the transistor of FIG. 12 may correspond to the fourth transistors T4_1 and T4_2 shown in FIG. 10, for example.

Referring to FIGS. 10, 11, and 12, each of the pixels PX may include the substrate 210, the buffer layer 220, the first gate insulating layer 240a, the second gate insulating layer 240b, the third transistors T3_1 and T3_2, the fourth transistors T4_1 and T4_2, the inter-insulating layer 260, the planarization layer 280, the pixel defining layer PDL, the emission element 300, the encapsulation layer 330, or the like. The third transistors T3_1 and T3_2 may include the first active layer 230b, first gate electrodes 251c, second gate electrodes 252c, and a first connection electrode 270c. The fourth transistors T4_1 and T4_2 may include the second active layer 340b, third gate electrodes 253c, a fourth gate electrode 254c, and a second connection electrode 271c. In addition, the emission element 300 may include the lower electrode 290, the emission layer 310, and the upper electrode 320. However, the pixel PX described with reference to FIGS. 11 and 12 may be substantially the same as or similar to the pixel PX described with reference to FIGS. 8 and 9 except for the structures of the third transistors T3_1 and T3_2 and the fourth transistors T4_1 and T4_2. Hereinafter, overlapping description will be omitted.

Referring to FIG. 11, in an embodiment, the second gate electrodes 252c may not overlap the first gate electrodes 251c. In an alternative embodiment, the second gate electrodes 252c may overlap at least a part of the first gate electrodes 251c. In an embodiment, the first gate electrodes 251c may be disposed between the second gate electrodes 252c, for example. That is, each of the first gate electrodes 251c may be disposed adjacent to the first drain region 232b or the second source region 233b, and each of the second gate electrodes 252c may be disposed adjacent to the first source region 231b or the second drain region 234b.

Referring to FIG. 12, the fourth gate electrode 254c may overlap the third active region 11a of the second active layer 340b. That is, the fourth gate electrode 254c may overlap the third channel region 345b of the third active region 11a.

In an embodiment, the fourth gate electrode 254c may not overlap the third gate electrodes 253c. In an alternative embodiment, the fourth gate electrode 254c may overlap at least a part of the third gate electrodes 253c. In an embodiment, each of the third gate electrodes 253c may be disposed adjacent to the third source region 341b or the fourth drain region 344b, and the fourth gate electrode 254c may be disposed adjacent to the fourth source region 343b, for example.

FIGS. 13, 14, 15, 16, and 17 are cross-sectional views illustrating an embodiment of a method of manufacturing a display device.

Figure 13:
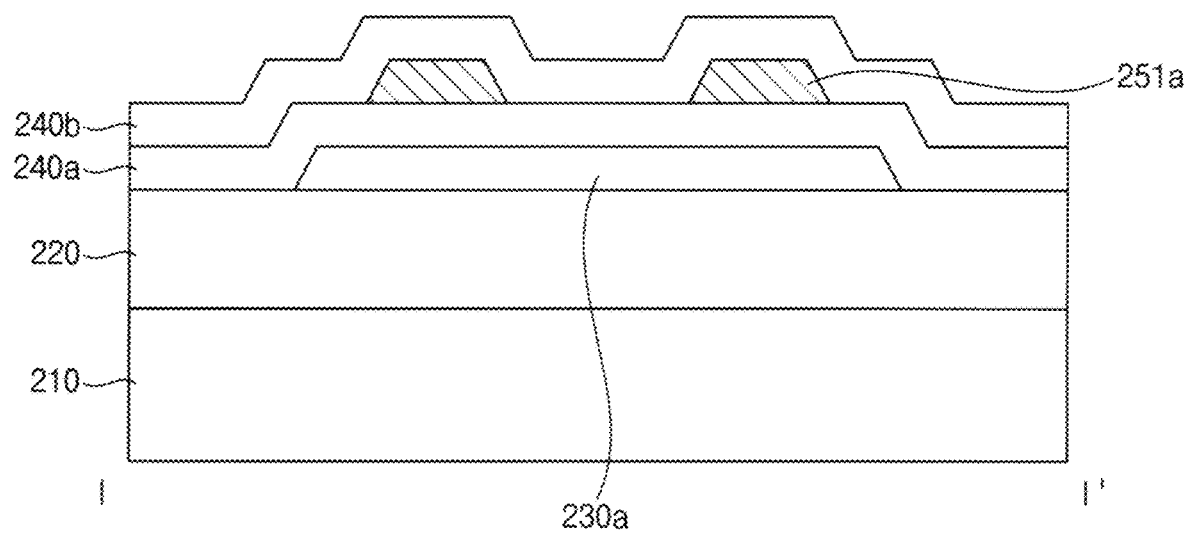
FIGS. 13, 14, 15, 16, and 17 are cross-sectional views illustrating an embodiment of a method of manufacturing a display device.

Referring to FIG. 13, the substrate 210 including a transparent or opaque material may be provided. The buffer layer 220 may be formed or provided on the substrate 210. In an embodiment, the buffer layer 220 may include an inorganic material, for example. The first active layer 230a may be formed or provided on the buffer layer 220. The first active layer 230a may include a silicon semiconductor. In an embodiment, after an amorphous silicon layer is formed or provided on the buffer layer 220, the amorphous silicon layer is crystallized, and a polycrystalline silicon layer may be formed or provided, for example.

The first gate insulating layer 240a may be formed or provided on the buffer layer 220 and the first active layer 230a. The first gate insulating layer 240a may cover the first active layer 230a. In an embodiment, the first gate insulating layer 240a may have a single-layer structure including silicon oxide, for example.

The two first gate electrodes 251a may be formed or provided on the first gate insulating layer 240a. The first gate electrodes 251a may be formed or provided to overlap the first active layer 230a. Each of the first gate electrodes 251a may include a metal, an alloy, or the like. In an embodiment, each of the first gate electrodes 251a may include molybdenum (Mo), for example.

The second gate insulating layer 240b may be formed or provided on the first gate insulating layer 240a and the first gate electrodes 251a. The second gate insulating layer 240b may cover the first gate electrodes 251a. In an embodiment, the second gate insulating layer 240b may have a single-layer structure including silicon nitride, for example.

Figure 14:
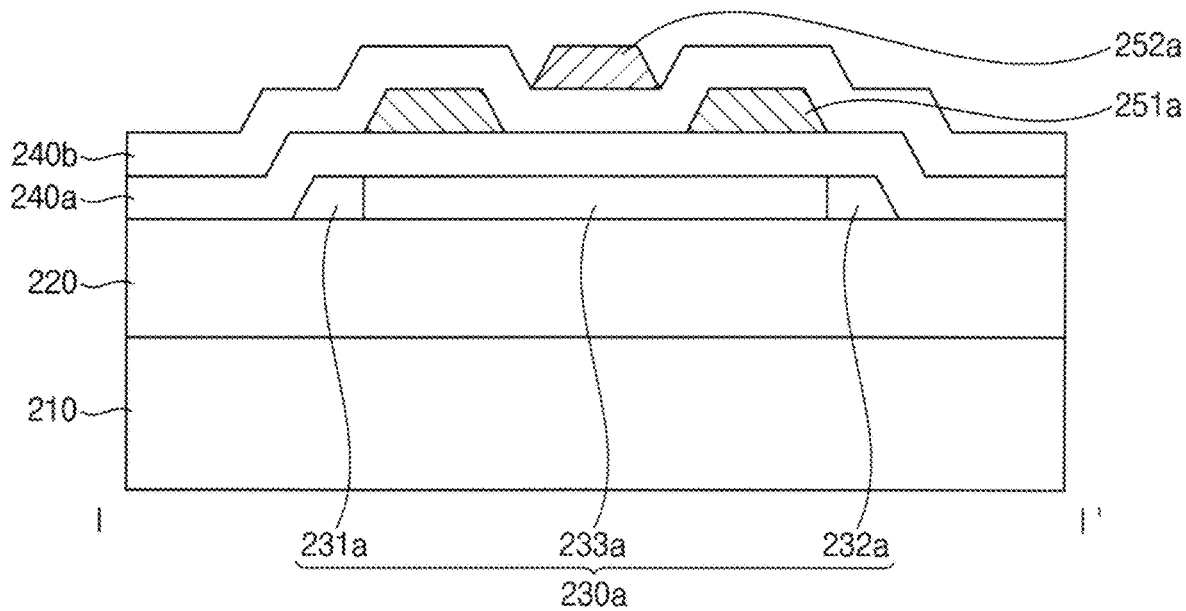

Referring to FIG. 14, the second gate electrode 252a may be formed or provided on the second gate insulating layer 240b. The second gate electrode 252a may be formed or provided to overlap the first active layer 230a. That is, the second gate electrode 252a may be formed or provided to overlap a central part of the first active layer 230a. The second gate electrode 252a may be formed so as not to overlap the first gate electrodes 251a. In an alternative embodiment, the second gate electrode 252a may be formed or provided to overlap at least a part of the first gate electrodes 251a. The second gate electrode 252a may include a metal, an alloy, or the like. In an embodiment, the second gate electrode 252a may include molybdenum, for example.

In an embodiment, the first active layer 230a may be doped with P-type impurity ions. That is, the first source region 231a and the first drain region 232a of the first active layer 230a that do not overlap the first and second gate electrodes 251a and 252a may be doped with P-type impurity ions. In an alternative embodiment, the first active layer 230a may be doped with N-type impurity ions.

Figure 15:
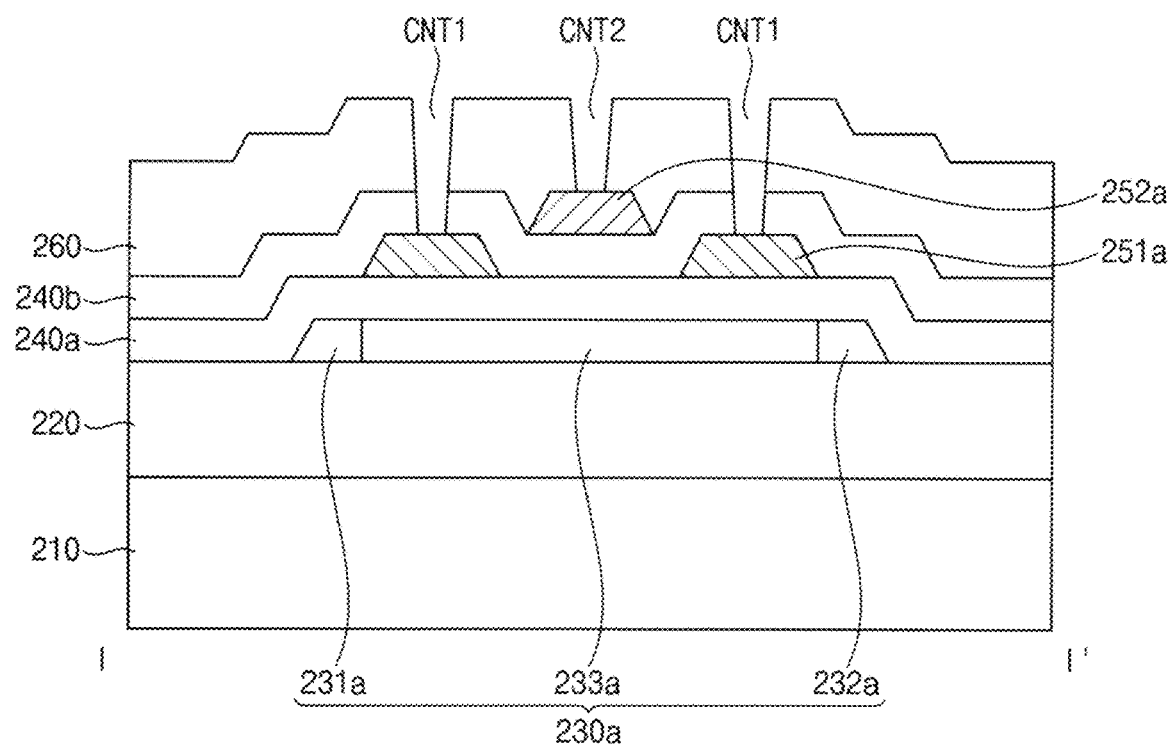

Referring to FIG. 15, the inter-insulating layer 260 may be formed or provided on the second gate insulating layer 240b. The inter-insulating layer 260 may cover the second gate electrode 252a. The inter-insulating layer 260 may include silicon oxide, silicon nitride, or the like, for example. In an embodiment, the inter-insulating layer 260 may have a multilayer structure including silicon oxide and silicon nitride, for example.

In an embodiment, the first contact holes CNT1 exposing a part of each of the first gate electrodes 251a may be defined by removing the second gate insulating layer 240b and the inter-insulating layer 260 through an etching process. The second contact hole CNT2 exposing a part of the second gate electrode 252a may be defined by removing a part of the inter-insulating layer 260 through the etching process. In this case, the first contact holes CNT1 and the second contact hole CNT2 may be simultaneously defined.

Figure 16:
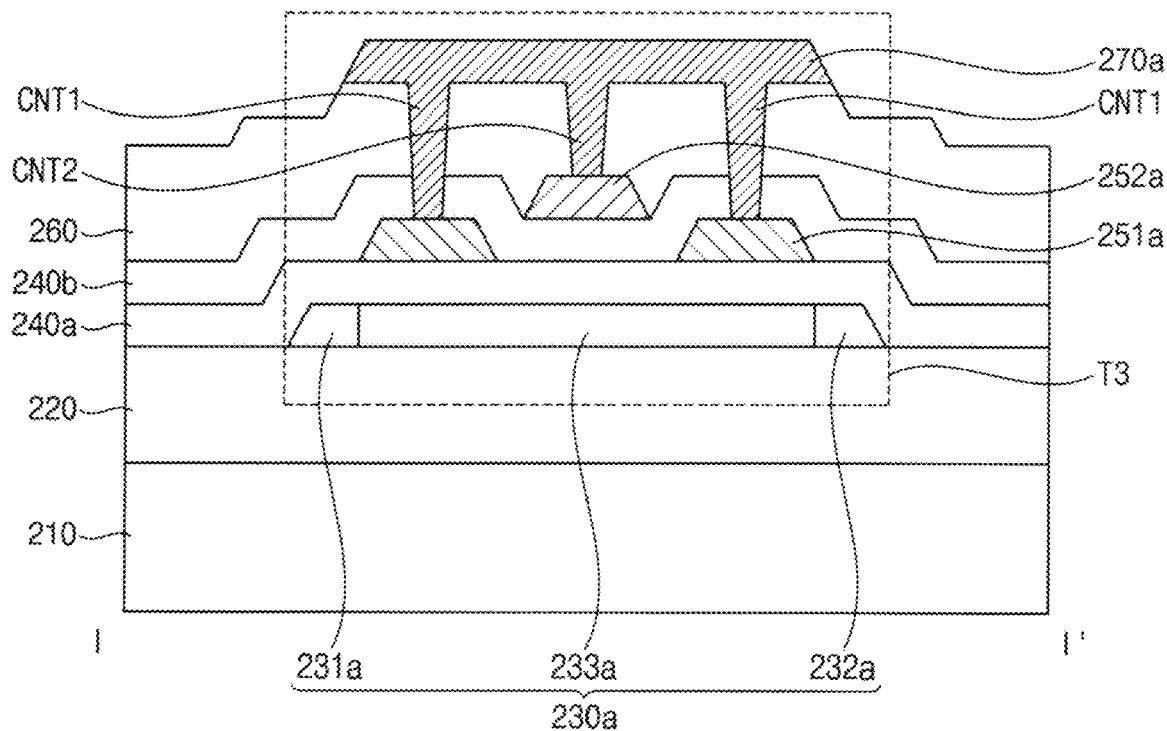

Referring to FIG. 16, the first connection electrode 270a may be formed or provided on the inter-insulating layer 260. That is, the first connection electrode 270a may be formed or provided while filling the first and second contact holes CNT1 and CNT2. The first connection electrode 270a may be connected to the first and second gate electrodes 251a and 252a respectively through the first and second contact holes CNT1 and CNT2. The first connection electrode 270a may include a metal, an alloy, or the like. In an embodiment, the first connection electrode 270a may include titanium (T1) and aluminum (Al), for example.

Figure 17:
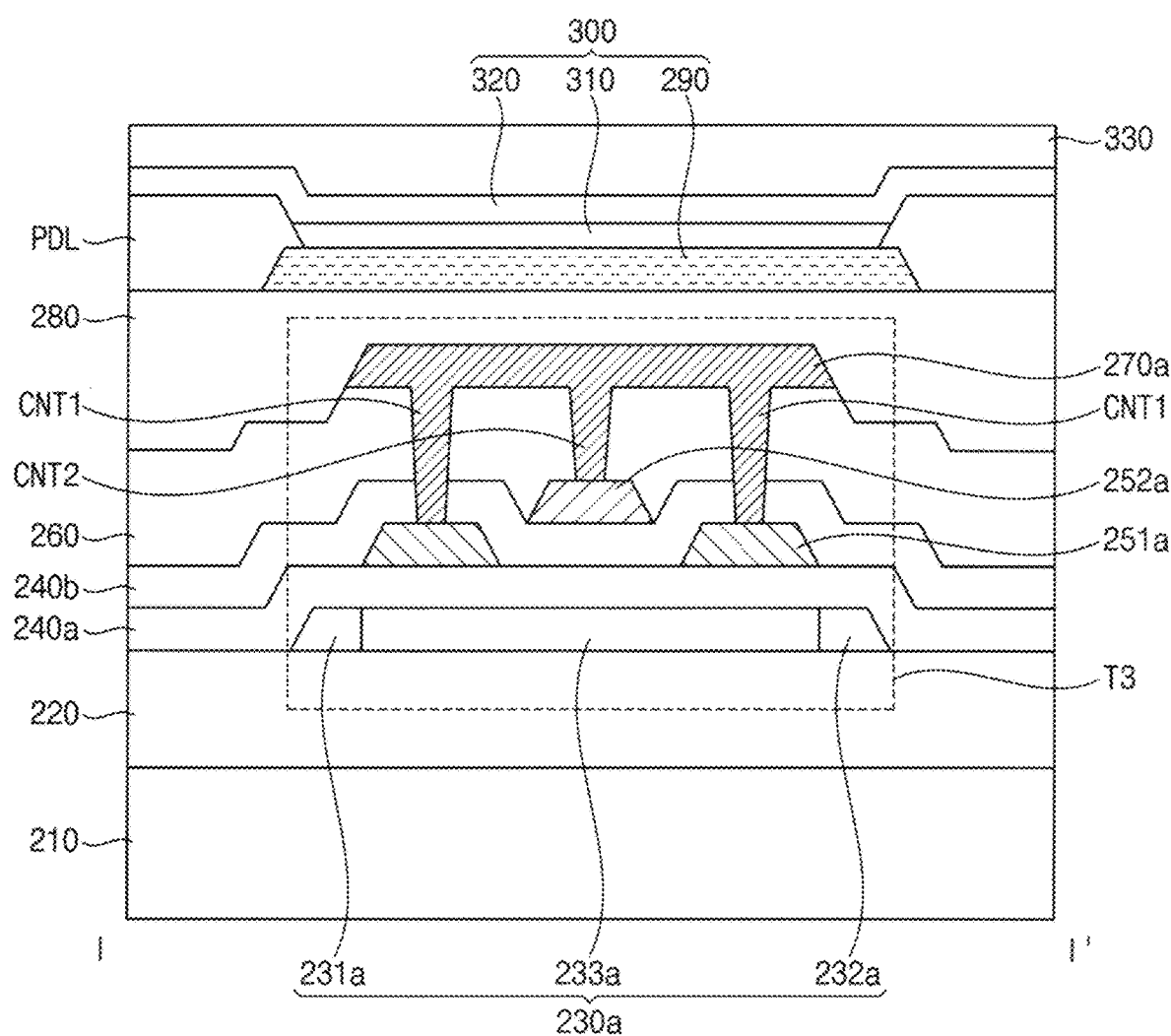

Referring to FIG. 17, the planarization layer 280 may be formed or provided on the first connection electrode 270a. The planarization layer 280 may sufficiently cover the first connection electrode 270a. The lower electrode 290 and the pixel defining layer PDL may be formed or provided on the planarization layer 280. The pixel defining layer PDL may form an opening exposing at least a part of the lower electrode 290. The emission layer 310 may be formed or provided on the lower electrode 290. That is, the emission layer 310 may be formed or provided on the lower electrode 290 exposed by the opening. The upper electrode 320 may be formed or provided on the pixel defining layer PDL and the emission layer 310.

Referring back to FIG. 4, the encapsulation layer 330 may be formed or provided on the upper electrode 320. The encapsulation layer 330 may include at least one inorganic layer and at least one organic layer.

Accordingly, the display device 1000 (refer to FIG. 1) shown in FIG. 4 may be manufactured.

Embodiments of the invention may be applied to a display device and an electronic device including the same. In an embodiment, the invention may be applied to high-resolution smartphones, mobile phones, smart pads, smart watches, tablet personal computers ("PCs"), vehicle navigation systems, televisions, computer monitors, notebook computers, or the like, for example.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:
    a substrate;
    a first active layer disposed on the substrate and including a first source region, a first drain region, and a first channel region disposed between the first source region and the first drain region;
    a first gate insulating layer covering the first active layer on the substrate;
    first gate electrodes respectively disposed on opposite sides of the first channel region and disposed directly on an upper surface defining the first gate insulating layer;
    a second gate insulating layer covering the first gate electrodes and disposed on the first gate insulating layer;
    a second gate electrode disposed in a central portion of the first channel region and disposed directly on an upper surface defining the second gate insulating layer; and
    a first connection electrode disposed on the second gate electrode and connected to the first and second gate electrodes.

2. The display device of claim 1, further comprising:
    a second active layer disposed on the substrate and including a second source region, a second drain region, and a second channel region disposed between the second source region and the second drain region;
    a third gate electrode disposed on a first side of the second channel region on the first gate insulating layer;
    a fourth gate electrode disposed on a second side of the second channel region on the second gate insulating layer; and
    a second connection electrode disposed on the fourth gate electrode and connected to the third and fourth gate electrodes.

3. The display device of claim 2, wherein the first active layer, the first and second gate electrodes, the first connection electrode are defined as a first transistor, and
    wherein the second active layer, the third and fourth gate electrodes, and the second connection electrode are defined as a second transistor.

4. The display device of claim 3, wherein the first transistor is a switching transistor and the second transistor is a driving transistor.

5. The display device of claim 2, wherein each of the first and second active layers includes a silicon semiconductor.

6. The display device of claim 2, wherein each of the first and second source regions and the first and second drain regions is doped with P-type or N-type impurity ions.

7. The display device of claim 1, wherein a shortest distance between the first active layer and the first gate electrodes is smaller than a shortest distance between the first active layer and the second gate electrode.

8. The display device of claim 1, wherein the first gate insulating layer includes silicon oxide and the second gate insulating layer includes silicon nitride.

9. The display device of claim 1, wherein a same signal is applied to the first and second gate electrodes.

10. The display device of claim 9, wherein the same signal is a scan signal.

11. The display device of claim 1, further comprising:
a first electrode disposed on the first connection electrode;
an emission layer disposed on the first electrode; and
a second electrode disposed on the emission layer.

12. A display device comprising:
a substrate;
a first active layer disposed on the substrate and including a first active region including a first source region, a first drain region, and a first channel region, and a second active region including a second source region, a second drain region, and a second channel region;
a first gate insulating layer covering the first active layer on the substrate;
first gate electrodes respectively overlapping the first and second channel regions and disposed directly on an upper surface defining the first gate insulating layer;
a second gate insulating layer covering the first gate electrodes and disposed on the first gate insulating layer;
second gate electrodes respectively overlapping the first and second channel regions and disposed directly on an upper surface defining the second gate insulating layer; and
a first connection electrode disposed on the second gate electrodes and connected to the first and second gate electrodes.

13. The display device of claim 12, further comprising:
a second active layer disposed on the substrate and including a third active region including a third source region, a third drain region, and a third channel region, and a fourth active region including a fourth source region, a fourth drain region, and a fourth channel region;
third gate electrodes respectively overlapping the third and fourth channel regions on the first gate insulating layer;
a fourth gate electrode overlapping the fourth channel region on the second gate insulating layer; and
a second connection electrode disposed on the fourth gate electrode and connected to the third and fourth gate electrodes.

14. The display device of claim 13, wherein the first active layer, the first and second gate electrodes, and the first connection electrode are defined as a first dual transistor in which first transistors are connected in series, and
wherein the second active layer, the third and fourth gate electrodes, and the second connection electrode are defined as a second dual transistor in which second transistors are connected in series.

15. The display device of claim 13, wherein the first drain region of the first active region is connected to the second source region of the second active region, and
wherein the third drain region of the third active region is connected to the fourth source region of the fourth active region.

16. The display device of claim 13, wherein each of the first and second active layers includes a silicon semiconductor.

17. The display device of claim 13, wherein each of the first to fourth source regions and the first to fourth drain regions is doped with P-type or N-type impurity ions.

18. The display device of claim 13, wherein the second gate electrodes are disposed between the first gate electrodes, and the fourth gate electrode is disposed between the third gate electrodes.

19. The display device of claim 12, wherein a shortest distance between the first active layer and the first gate electrodes is smaller than a shortest distance between the first active layer and the second gate electrodes.

20. The display device of claim 12, wherein a same signal is applied to the first and second gate electrodes.

* * * * *